United States Patent
Majumdar et al.

(10) Patent No.: US 6,724,169 B2
(45) Date of Patent: *Apr. 20, 2004

(54) CONTROLLER FOR POWER DEVICE AND DRIVE CONTROLLER FOR MOTOR

(75) Inventors: Gourab Majumdar, Fukuoka (JP); Shinji Hatae, Fukuoka (JP); Tatsuo Oota, Fukuoka (JP); Masanori Fukunaga, Amagasaki (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/260,406

(22) Filed: Oct. 1, 2002

(65) Prior Publication Data

US 2003/0030394 A1 Feb. 13, 2003

Related U.S. Application Data

(62) Division of application No. 08/775,308, filed on Dec. 31, 1996, now Pat. No. 6,522,098, which is a continuation of application No. 08/373,435, filed on Jan. 17, 1995, now Pat. No. 6,005,366.

(30) Foreign Application Priority Data

Jan. 20, 1994 (JP) .............................. 6-004678
Mar. 29, 1994 (JP) .............................. 6-059573

(51) Int. Cl.[7] .................................. H02P 5/28
(52) U.S. Cl. .................. 318/811; 318/812; 318/801
(58) Field of Search .................... 318/811, 812, 318/801, 798, 815; 365/185.18

(56) References Cited

U.S. PATENT DOCUMENTS

| | | | | |
|---|---|---|---|---|
| 5,216,587 A | * | 6/1993 | Miyazaki et al. | ....... 363/56.02 |
| 6,005,366 A | | 12/1999 | Majumdar et al. | |
| 6,160,735 A | * | 12/2000 | Hirano | ............... 365/185.18 |
| 6,201,437 B1 | * | 3/2001 | Kono et al. | ................ 327/545 |

FOREIGN PATENT DOCUMENTS

| | | |
|---|---|---|
| DE | 3813672 | 11/1988 |
| DE | 4032014 | 5/1991 |
| JP | 2-164267 | 6/1990 |
| JP | 3-280619 | 12/1991 |
| JP | 4-364375 | 12/1992 |
| JP | 5-316755 | 11/1993 |

OTHER PUBLICATIONS

Electronics World and Wirless World, vol. 97, No. 1671, pp. 146–147, Feb. 1, 1992, Hurst Green, "Floating MOS–Gate Driver".

Electronique Applications, vol. 63, pp. 33–38, Dec. 1988, "Double Circuit De Commande Pour MOSFET De Puissance Ou IGBT Haute Tension".

Proceedings of the International Symposium on Power Semiconductor Devices and IC's, No. Symp. 3, pp. 248–253, Apr. 1991, Hideki Miyazaki, et al., "A Novel High Voltage Three–Phase Monolithic Inverter IC wiht Two Current Levels Sensing".

* cited by examiner

Primary Examiner—Karen Masih
(74) Attorney, Agent, or Firm—Oblon, Spivak, McClelland, Maier & Neustadt, P.C.

(57) ABSTRACT

A controller for controlling a power device in response to an input signal includes a first signal generator for generating a first signal in response to the input signal; a level shifter for changing an output level of the first signal to a value which is a function of a first main power supply potential in order to produce a second signal; and a first control signal generator for generating the control signal for a first semiconductor device in response to the second signal. The level shifter includes at least one level shifting semiconductor element wherein the semiconductor element is controlled by the first signal and the at least one level shifting semiconductor element exhibiting breakdown voltage characteristics whereby a breakdown voltage has a value not less than a voltage in the range between a value of the first and a value of a second main power supply potential.

17 Claims, 27 Drawing Sheets

CONTROLLER FOR POWER DEVICE AND DRIVE CONTROLLER FOR MOTOR

BACKGROUND OF THE INVENTION

1. Field of the Invention

The present invention relates to a controller for power devices and, more particularly, to a controller for power devices employing high-breakdown-voltage semiconductor elements.

2. Description of the Background Art

FIG. 26 is a circuit diagram of a drive circuit for an AC input three-phase motor which is an example of background art controllers for power devices employing high-breakdown-voltage semiconductor elements. As shown in FIG. 26, an AC three-phase power supply APW serving as a power supply for an AC input three-phase motor M is connected to a converter circuit CC1 between lines P and N, and the respective phases of the AC input three-phase motor M are connected to inverter circuits I1, I2, I3 for controlling the phases, respectively.

The inverter circuit I1 (I2, I3) includes a pair of transistors Q1 and Q2 (Q3 and Q4; Q5 and Q6) which are power devices, such as IGBTs (insulated gate bipolar transistors), totem-pole connected between the lines P and N, and a control block SB1 (SB2, SB3). Inputs of the respective phases of the motor M are connected to connection points U, V, W of the totem-pole connected transistors, respectively. Free-wheeling diodes D1 to D6 are connected in inverse-parallel with the transistors Q1 to Q6, respectively. Between the lines P and N are connected a smoothing capacitor C and a brake circuit BK for use in applying electrical brakes to the AC input three-phase motor M and including a diode D7 and a transistor Q7 connected in series. A brake resistor BR exteriorly attached is connected in parallel with the diode D7 in the brake circuit BK. A control block SB4 is connected to the gate electrode of the transistor Q7.

The control blocks SB1, SB2, SB3 forming the inverter circuits I1, I2, I3 and the control block SB4 are connected to an external controller 6 employing a microcomputer and the like. A DC power supply DPW for operating the control blocks SB1, SB2, SB3 is a power supply receiving a single-phase output from the AC three-phase power supply APW. The single-phase output from the AC three-phase power supply APW is connected to primary coils of an isolation transformer TR through a converter circuit CC2. Two DC outputs from secondary coils of the isolation transformer TR are applied to the control blocks SB1, SB2, SB3 through converter circuits. For instance, DC outputs X and Y are applied to the inverter circuit I1.

The arrangement of the control block SB1 of the inverter circuit I1 is shown in FIG. 27. Referring to FIG. 27, control circuits LS1 and LS2 employing LVICs (low-voltage ICs) are connected to the gate electrodes of the transistors Q1 and Q2, respectively. Insulation circuits Z1 and Z2 are connected to the control circuits LS1 and LS2, respectively. Reference potentials G1 and G2 for the control circuits LS1 and LS2 are based on different potentials.

Operation will be discussed with reference to FIGS. 26 and 27. Referring to FIG. 26, the converter circuit CC1 converts a 400 V AC input voltage to a voltage of about 600 V DC which is applied between the lines P and N. Then the smoothing capacitor C between the lines P and N is charged, and ripple on the power supply line is suppressed. The voltage of about 600 V DC is provided as main power supplies for the inverter circuits I1, I2, I3.

Referring to FIG. 27, since the connection point U serving as an output of the inverter circuit I1 is provided between the totem-pole connected transistors Q1 and Q2, the reference potential G1 for the control circuit LS1 is, for example, the 600 V main power supply voltage when the transistor Q1 is ON. In such a construction, a voltage as high as 600 V is applied to the control circuit LS1 if the reference potential G1 for the control circuit LS1 is a ground potential of 0 V.

The LVIC forming the control circuit LS1 normally has an operating voltage of not more than 30 V and is not constructed to withstand the voltage as high as 600 V. Hence, the control circuit LS1 is designed such that the reference potential G1 for the control circuit LS1 is held floating from the ground potential and the main power supply voltage of 600 V becomes the reference potential G1 when the transistor Q1 is ON. A portion in which the main power supply potential is the reference potential is referred to hereinafter as a high potential portion, and a portion in which the ground potential is the reference potential, such as the control circuit LS2, as a low potential portion. It should be noted that the control circuit LS2 in the low potential portion is held floating in the same manner as the control circuit LS1.

To that end, the DC power supplies X and Y insulated through the isolation transformer TR and then rectified by the converter circuit are applied to the control circuits LS1 and LS2 for driving thereof. Further, a control signal from the external controller 6 is applied to the control circuits LS1 and LS2 through the insulation circuits Z1 and Z2 including insulating means such as photocouplers. The DC power supplies X and Y are fed to drive the insulation circuits Z1, Z2 and the control circuits LS1, LS2.

Each of the inverter circuits I2 and I3 includes circuits similar to the insulation circuits Z1, Z2 and the control circuits LS1, LS2 and requires power supplies similar to the DC power supplies X and Y. The drive circuit for the AC input three-phase motor requires at least four DC power supplies since separate DC power supplies are connected respectively to the control circuits in the high potential portions such as the control circuit LS1 and a DC power supply is commonly connected to the control circuits in the low potential portions similar to the control circuit LS2.

The brake circuit BK applies electrical brakes to the motor M which tends to keep rotating after receiving a stop signal from the external controller 6. The circuit arrangement of the control block SB4 for controlling the transistor Q7 is similar to that of the circuits for controlling the low potential transistors in the control blocks SB1 to SB3, and is connected to the external controller 6.

The inverter circuits I1, I2, I3 are well known in the art, and the description of the detailed circuit arrangements thereof will be omitted herein.

As above stated, the conventional controller for the power devices has required particular insulating elements such as photocouplers for insulation of the control signal. In particular, insulation of high-frequency noises has necessitated an advanced insulation technique and costly insulating elements.

The control signal is given from the external controller 6 through the insulating means, resulting in the power devices being less responsive to the control signal and being difficult to integrate.

Further, it has been necessary to individually apply the drive power supply to the control circuits positioned in the high and low potential portions through the isolation transformer TR, which causes an increased size of the power supply portion and a large amount of power consumption.

The need for the particular insulating elements, such as photocouplers, as insulating means results in an increased size of a module (Intelligent Power Module; referred to as an IPM hereinafter) designed such that an integrated controller for power devices including a protective circuit, the power devices, and a control power supply are encapsulated in a single package.

SUMMARY OF THE INVENTION

For a power device including in-series connected first and second semiconductor circuits between first and second main power supply potentials, the conduction of at least the first semiconductor circuit being controllable by a control signal, the first and second semiconductor circuits providing an output at their connection node, the present invention is intended for a controller for controlling the power device in response to an input signal generated based on the second main power supply potential. According to the present invention, the controller comprises: first signal generator means for generating a first signal in response to the input signal; level shift means for level-shifting the first signal toward the first main power supply potential to produce a second signal; and control signal generator means for generating the control signal for the first semiconductor circuit in response to the second signal, wherein the level shift means includes at least one level shifting semiconductor element between the first and second main power supply potentials and controlled by the first signal, the at least one level shifting semiconductor element having a breakdown voltage characteristic which is not less than a voltage between the first and second main power supply potentials.

According to the controller of the present invention, the first semiconductor circuit is controlled by the input signal generated on the basis of the second main power supply potential through the level shift means including at least one level shifting semiconductor element between the first and second main power supply potentials and controlled by the first signal and having the breakdown voltage characteristic which is not less than the voltage between the first and second main power supply potentials. This increases the responsiveness of the power device to the control signal and improves the integration.

Preferably, the first signal generator means includes pulse generator means for generating a pulse in response to level transition of the input signal to use the pulse as the first signal; the second signal is a shifted pulse obtained by level-shifting the pulse by the level shift means; and the control signal generator means includes latch means for latching the shifted pulse as the first signal to generate the control signal for the first semiconductor circuit.

The pulse responsive to the level transition of the input signal is level-shifted to provide the shifted pulse which acts as the control signal for the first semiconductor circuit. The first signal generator means, the level shift means, and the control signal generator means are simple in construction.

Preferably, the pulse generator means is means for generating first and second pulses in response to positive and negative level transitions of the input signal, respectively, to use the first and second pulses as the first signal; the level shift means includes first and second level shifting semiconductor elements provided between the first and second main power supply potentials and having a breakdown voltage characteristic which is not less than a voltage between the first and second main power supply potentials, the first and second level shifting semiconductor elements level-shifting the first and second pulses toward the first main power supply potential to generate first and second shifted pulses, thereby to provide the second signal; and the latch means latches the second signal including the first and second shifted pulses to use the second signal as the control signal for the first semiconductor circuit.

The first and second pulses responsive to the positive and negative level transitions of the input signal are level-shifted to produce the first and second shifted pulses which act as the control signal for the first semiconductor circuit. With the input signal applied over a long period of time, the level shifting semiconductor elements are prevented from receiving loads over a long period of time and are thus protected. This permits reduction in power consumption.

Preferably, the controller further comprises first operation abnormality detector means for detecting an abnormal operation in the first semiconductor circuit to generate a first abnormality indication signal having a level based on the first main power supply potential; and the level shift means further includes a third level shifting semiconductor element provided between the first and second main power supply potentials and having a breakdown voltage characteristic which is not less than a voltage between the first and second main power supply potentials, the third level shifting semiconductor element level-shifting the first abnormality indication signal toward the second main power supply potential to produce a second abnormality indication signal; and the second abnormality indication signal is a feedback signal to a circuit for generation of the input signal.

Since the first abnormality indication signal indicative of the abnormal operation in the first semiconductor circuit is level-shifted toward the second power supply potential by the third level shifting semiconductor element and is fed back to the circuit for generation of the input signal, the input signal is controlled to cancel the abnormal operation in the first semiconductor circuit.

Preferably, the first operation abnormality detector means includes abnormality indication signal pulse generator means for generating a pulse in response to level transition of the first abnormality indication signal to use the pulse as a pulse signal for the first abnormality indication signal; the second abnormality indication signal is a shifted pulse obtained by level-shifting the pulse signal for the first abnormality indication signal by the third level shifting semiconductor element; and the level shift means includes feedback signal latch means for latching the shifted pulse as the second abnormality indication signal to generate the feedback signal to the circuit for generation of the input signal.

The first abnormality indication signal indicative of the abnormal operation in the first semiconductor circuit is converted into the pulse signal, which is level-shifted toward the second main power supply potential by the third level shifting semiconductor element. The level-shifted signal is applied to the circuit for generation of the input signal as the feedback signal by the feedback signal latch means. This provides the more practical controller for canceling the abnormal operation in the first semiconductor circuit.

Preferably, a first controllable semiconductor element included in the first semiconductor circuit and the first and second level shifting semiconductor elements are of a first conductivity type; and the third level shifting semiconductor element is of a second conductivity type.

The level shift from the second main power supply potential to the first main power supply potential and the level shift from the first main power supply potential to the second main power supply potential are performed without hindrance. The practical circuit arrangement is achieved.

Preferably, the control signal for the first controllable semiconductor element is a first control signal; the control signal generator means is first control signal generator means; the second semiconductor circuit includes a second controllable semiconductor element, the conduction of which is controllable by a second control signal; and the controller further comprises second control signal generator means for generating the second control signal in response to the input signal.

The conduction of the second semiconductor circuit is also controllable. This meets the requirement for the controller to control both the first and second semiconductor circuits.

According to another aspect of the present invention, for a power device including in-series connected first and second semiconductor circuits between first and second main power supply potentials, the conduction of the first and second semiconductor circuits being controllable by first and second control signals, respectively, the first and second semiconductor circuits providing an output at their connection node, a controller for generating the first and second control signals in response to an input signal generated based on the second main power supply potential, the controller comprises: at least one semiconductor element having a breakdown voltage characteristic which is not less than a voltage between the first and second main power supply potentials for generating the first control signal in response to the input signal and for separating potential levels of the first and second control signals from each other.

Since the first semiconductor circuit is controlled by the input signal generated on the basis of the second main power supply potential, the responsiveness of the power device to the control signal is increased, and the integration is improved.

Preferably, the controller further comprises: a current detecting resistor between an electrode of the second controllable semiconductor element which outputs a main current and the second main power supply potential for detecting and converting the main current flowing through the second controllable semiconductor element into a voltage signal corresponding to the main current; and analog signal output means receiving the voltage signal corresponding to the main current for feeding back a value of the main current indicated by the voltage signal to the second control signal generator means in the form of an analog signal.

The main current for the second controllable semiconductor element is converted into the voltage signal, and the analog signal output means feeds back the value of the main current indicated by the voltage signal to the second control signal generator means as the analog signal. The operation of the second controllable semiconductor element is sensed in real time, and the analog signal output means is readily modularized. This permits size reduction of the device.

Preferably, the analog signal output means includes: delay signal generator means for causing the second control signal to delay to generate a delay signal; a gate element having an input and an output and receiving the voltage signal at the input for opening and closing a transmission path of the voltage signal from the input to the output in response to the delay signal; and a capacitor between the output of the gate element and the second main power supply potential, and the analog signal is provided at the output.

This provides the more practical analog signal output means.

Preferably, the controller further comprises: second operation abnormality detector means for detecting an abnormal operation in the second semiconductor circuit to generate a third abnormality indication signal having a level based on the second main power supply potential; and abnormality indication signal identifying means for identifying the second and third abnormality indication signals to feed back a result of the identification to the circuit for generation of the input signal.

The abnormal conditions in the first and second controllable semiconductor elements can be identified, and these means are readily modularized. This permits size reduction of the device.

Preferably, the controller further comprises: input interlock means for detecting timings of generation of the first and second control signals to prevent the first and second control signals from being outputted simultaneously.

The disadvantage due to simultaneous operation of the first and second controllable semiconductor elements is prevented.

Preferably, the controller further comprises: PWM signal generator means for generating first and second PWM signals in response to the input signal, the first and second control signals being generated in response to the first and second PWM signals, respectively.

This allows generation of a signal pattern which turns ON one of the first and second controllable semiconductor elements.

Preferably, the controller is integrated on a single or a plurality of semiconductor substrates and is driven by a single operation power supply for feeding a voltage between the first and second main power supply potentials.

Size reduction of the device is accomplished.

The present invention is also intended for a drive controller for a motor. According to the present invention, the drive controller comprises: in-series connected first and second semiconductor circuits between first and second main power supply potentials; a controller for a power device as recited above; a brake circuit in parallel with the first and second semiconductor circuits for applying an electrical brake to the motor in response to a predetermined stop signal; and a converter circuit for rectifying an AC power supply to provide the first and second main power supply potentials, the first and second semiconductor circuits, the controller, the brake circuit, and the converter circuit being provided in the form of a module.

The motor drive controller is achieved which is reduced in size and has a good responsiveness of the motor to the control signal.

Preferably, the module includes an active filter circuit for increasing a power rate of the drive controller.

There is no need to provide the active filter circuit on the outside of the device. In addition, the motor drive controller is reduced in size.

Preferably, the module includes a power supply circuit for supplying power for the controller recited above from the AC power supply.

The size-reduced motor drive controller is accomplished.

Preferably, the drive controller further comprises: a charge pump circuit between the power supply circuit and a connection point of the first and second semiconductor circuits, the charge pump circuit including a first diode and a capacitor connected in series in order from a positive output of the power supply circuit; and a second diode between the first diode and a control electrode of the first controllable semiconductor element of the first semiconductor circuit, the second diode having a negative electrode connected to a negative electrode of the first diode.

The provision of the second diode in the charge pump circuit prevents the potential at the control electrode of the first controllable semiconductor element of the first semiconductor circuit from increasing due to electrical induction generated during the operation of the second semiconductor circuit. This prevents simultaneous operation of the first and second semiconductor circuits and, accordingly, prevents a short circuit between the first and second power supply potentials.

It is therefore a primary object of the present invention to provide controller for a power device which requires no particular elements for individually insulating high and low potential portions and no insulated power supplies.

It is another object of the invention to provide a drive controller for a motor which employs the controller of the power device and which is modularized.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
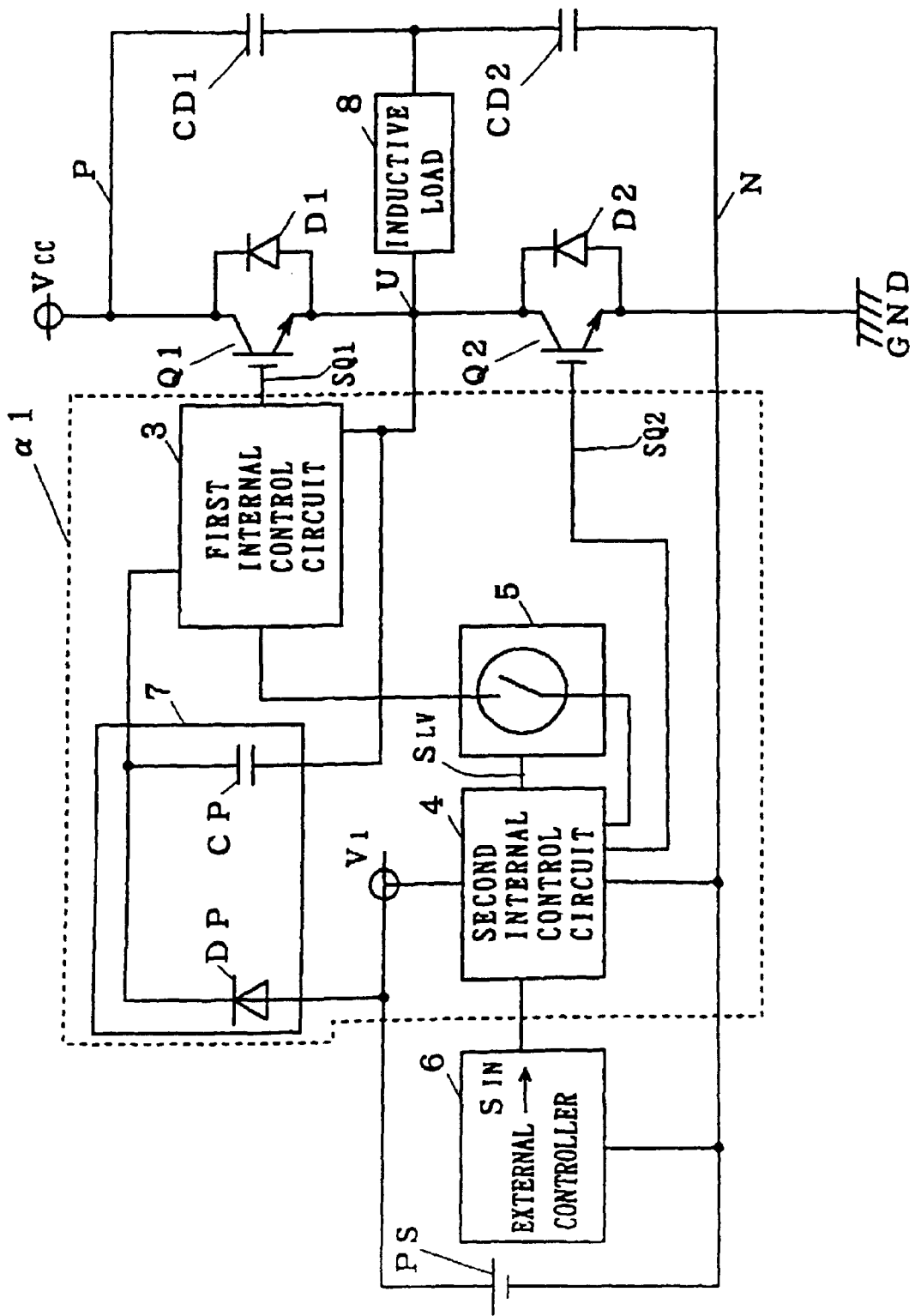
FIGS. 1 to 3 illustrate a controller for a power device according to a first preferred embodiment of the present invention.

FIG. 1 is a circuit diagram of a controller for power devices according to a first preferred embodiment of the present invention. Referring to FIG. 1, transistors Q1 and Q2 which are power devices such as IGBTs (insulated gate bipolar transistors) and which have a high breakdown voltage characteristic (for example, a breakdown voltage of not less than 800 V) are totem-pole connected between main power supply lines P and N. Free-wheeling diodes D1 and D2 are connected in inverse-parallel with the transistors Q1 and Q2, respectively. The transistors Q1, Q2 and a transistor $Q_{LV}$ to be described later are N-channel transistors.

An inductive load 8 has a first end connected to a connection point U between the emitter electrode of the transistor Q1 and the collector electrode of the transistor Q2 which are totem-pole connected, and a second end connected to a connection point of capacitors CD1 and CD2 connected in series between the lines P and N. The main power supply line P is connected to a power supply potential $V_{CC}$ and the main power supply line N is connected to a ground potential GND.

The transistors Q1 and Q2 are drive controlled on the basis of different control signals $S_{Q1}$ and $S_{Q2}$, respectively. The control signal $S_{Q1}$ is based on the power supply potential $V_{CC}$ and the control signal $S_{Q2}$ is based on the ground potential GND.

Construction of a controller α1 for controlling the transistors Q1 and Q2 will be discussed below. The controller α1 is connected to an external controller 6 employing a microcomputer and the like. The external controller 6 is connected to a second internal control circuit 4 which is in turn connected to a level shift circuit 5 and the gate electrode of the transistor Q2.

A voltage V1 is applied to the controller α1 from a control power supply PS to operate the controller α1. The reference potentials for the external controller 6, the second internal control circuit 4, and the level shift circuit 5 are the ground potential GND.

The level shift circuit 5 is connected to a first internal control circuit 3 which is in turn connected to the gate electrode of the transistor Q1. A charge pump circuit 7 is connected to the first internal control circuit 3. The reference potential for the first internal control circuit 3 is the potential at the connection point U.

The charge pump circuit 7 includes a diode DP and a capacitor CP which have a high breakdown voltage characteristic (for example, a breakdown voltage of not less than 800 V). The diode DP has a positive electrode connected to a power supply line of the voltage V1, and a negative electrode connected to the first internal control circuit 3. The capacitor CP is connected between the negative electrode of the diode DP and the connection point U.

The charge pump circuit 7 operates in a manner to be described below. When the transistor Q1 is OFF and the transistor Q2 is ON, the potential at the connection point U approximates the ground potential GND. Then current flows from the control power supply PS through the diode DP, the capacitor CP and the transistor Q2 to the ground potential GND. Part of the current is a charging current for the capacitor CP, and a voltage corresponding to the electrical charge is developed across the capacitor CP. Since a forward voltage drop is small in the diode DP, the voltage across the capacitor CP substantially equals a voltage developed by the control power supply PS. Thus, the voltage corresponding to that developed by the control power supply PS is applied to the first internal control circuit 3.

When the transistor Q1 is ON and the transistor Q2 is OFF, the potential at the connection point U is generally equal to the power supply voltage $V_{CC}$. The potential at the connection point of the diode DP and the capacitor CP is higher than the potential at the connection point U by the voltage across the capacitor CP which is generally equal to the voltage developed by the control power supply PS as above described. Thus, the voltage corresponding to that developed by the control power supply PS is applied to the first internal control circuit 3. The capacitor CP is discharged in certain amounts by feeding the supply power to the first internal control circuit 3 but is charged by the control power supply PS in compensation for the discharge when the transistor Q1 turns OFF and the transistor Q2 turns ON again.

As above stated, the voltage higher than the potential at the connection point U by a relatively substantially constant voltage is fed from the charge pump circuit 7 to the first internal control circuit 3 if the transistors Q1 and Q2 turn ON in an alternating manner thereby varying the potential at the connection point U between the power supply potential $V_{CC}$ and the ground potential GND.

The use of the charge pump circuit 7 allows the control power supply PS in the low potential portion to place into operation the control circuits in the high and low potential portions, that is, the first and second internal control circuits 3 and 4 thereby to control the transistors Q1 and Q2. This accomplishes a single control power supply.

Operation of the controller α1 will be described with reference to FIGS. 1 to 3. Referring now to FIG. 1, a pulse signal for alternately driving the transistors Q1 and Q2 for switching operation thereof is applied in the form of an input signal $S_{IN}$ to the second internal control circuit 4 from the external controller 6. The second internal control circuit 4 receives the input signal $S_{IN}$ and provides a control signal $S_{LV}$ for drive control of the level shift circuit 5 and applies a control signal $S_{Q2}$ to the gate electrode of the transistor Q2.

The transistors Q1, Q2, the diode DP and a transistor $Q_{LV}$ to be described later (FIG. 2) are required to have a breakdown voltage of about 1200 V in consideration of an overshoot voltage developed during the ON/OFF operation of the transistor Q1 where the main power supply potential is 800 V.

<Second Internal Control Circuit 4>

Figure 2:
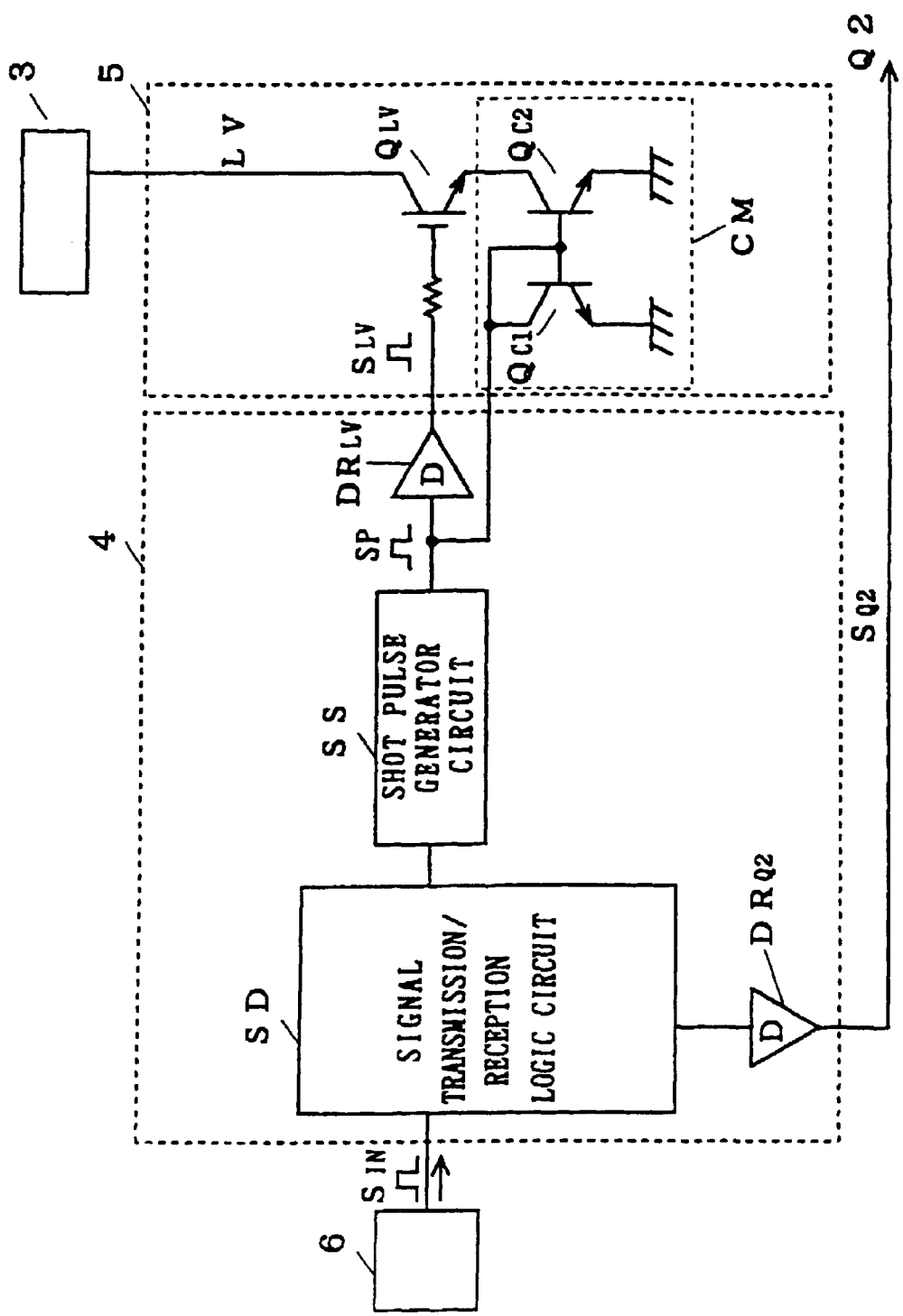

FIG. 2 is a circuit diagram of the second internal control circuit 4 and the level shift circuit 5. Referring to FIG. 2, the second internal control circuit 4 includes a signal transmission/reception logic circuit SD and a shot pulse generator circuit SS. The signal transmission/reception logic circuit SD includes a logic circuit and judges whether the entered input signal $S_{IN}$ is to be applied to the transistor Q1 or to the transistor Q2. When the input signal $S_{IN}$ is to be applied to the transistor Q1, the signal transmission/ reception logic circuit SD directs the shot pulse generator circuit SS to transmit a shot pulse SP based on the input signal $S_{IN}$ to the level shift circuit 5. The shot pulse SP is applied to the level shift circuit 5 through a driver circuit $DR_{LV}$ in the form of the control signal $S_{LV}$. On the other hand, when the input signal $S_{IN}$ is to be applied to the transistor Q2, the signal transmission/reception logic circuit SD applies the control signal $S_{Q2}$ to the transistor Q2 through a driver circuit $DR_{Q2}$.

<Level Shift Circuit 5>

The level shift circuit 5 includes a current mirror circuit CM and a transistor $Q_{LV}$ having a high breakdown voltage characteristic (for example, a breakdown voltage of not less than 800 V). The current mirror circuit CM includes a transistor $Q_{C1}$ having connected collector and gate electrodes, and a transistor $Q_{C2}$ having a gate electrode connected to the collector electrode of the transistor $Q_{C1}$. The collector electrode of the transistor $Q_{C1}$ is connected to the shot pulse generator circuit SS, and the collector electrode of the transistor $Q_{C2}$ is connected to the emitter electrode of the transistor $Q_{LV}$. In some cases, the collector electrode of the transistor $Q_{C1}$ is connected to the output of the driver circuit $DR_{LV}$.

Upon turning ON in response to the control signal (pulse) $S_{LV}$ from the second internal control circuit 4, the transistor $Q_{LV}$ applies a level shift signal LV as a shifted pulse to the first internal control circuit 3. The level shift signal LV in this case is provided as a low potential signal specified by the ground potential GND. (The low potential signal is referred to as "L" and a high potential signal as "H" hereinafter.)

The reason for provision of the current mirror circuit CM will be described below. When the transistor $Q_{LV}$ is ON, current flowing through the transistor $Q_{LV}$ varies, with a constant voltage applied to the transistor $Q_{LV}$, to thermally stress the transistor $Q_{LV}$, in some cases deteriorating its characteristics and shortening its life as an element. The provision of the current mirror circuit CM between the ground potential and the emitter electrode of the transistor $Q_{LV}$ limits the current flowing through the transistor $Q_{C1}$ and accordingly limits the current flowing through the transistor $Q_{LV}$, thereby reducing the thermal stresses on the transistor $Q_{LV}$.

<First Internal Control Circuit 3>

Figure 3:
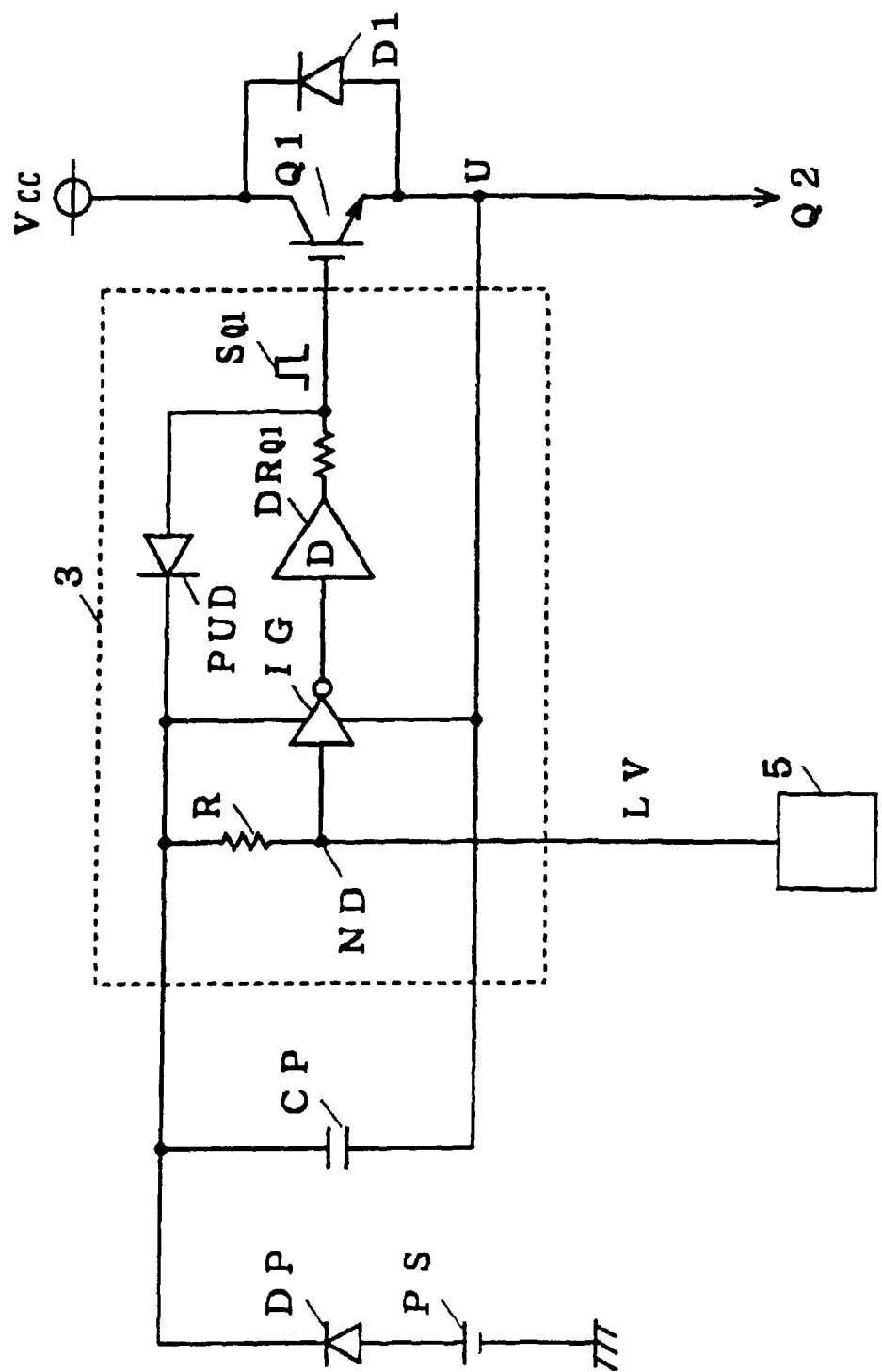

FIG. 3 is a circuit diagram of the first internal control circuit 3. The first internal control circuit 3 includes a resistor R and an inverter IG as shown in FIG. 3. The level shift circuit 5 is connected to the negative electrode of the diode DP, and the resistor R is connected between the negative electrode of the diode DP and the level shift circuit 5. The input of the inverter IG connected in parallel with the capacitor CP is connected to a connection point ND between the resistor R and the level shift circuit 5.

The capacitor CP is charged by the control power supply SP. Thus, the signal potentials "H" and "L" of the inverter IG are determined by the voltage charging the capacitor CP.

On receipt of the level shift signal LV from the level shift circuit 5, the connection point ND has the "L" potential, and the output signal from the inverter IG which is "H" is applied to a driver circuit $DR_{Q1}$. Then a control signal $S_{Q1}$, which is "H" is applied to the transistor Q1 through the driver circuit $DR_{Q1}$, and the transistor Q1 turns ON.

The inverter IG in the simplest form is achieved by connecting the source electrode of a P-channel MOS transistor to the negative electrode of the diode DP and connecting the drain electrode thereof to the driver circuit $DR_{Q1}$. In this case, the level shift signal LV from the level shift circuit 5 which is "L" is applied to the gate electrode of the P-channel MOS transistor to turn ON the P-channel MOS transistor which then provides an "H" output signal to the driver circuit $DR_{Q1}$.

There is provided, in FIG. 3, a diode PUD having a positive electrode connected to the gate electrode of the transistor Q1 and a negative electrode connected to the negative electrode of the diode DP. In the operation of the charge pump circuit 7, the transistor Q2 when turned ON may induce the gate electrode of transistor Q1 to have a raised potential to simultaneously turn ON the transistor Q1, resulting in a short circuit between the lines P and N. To prevent such a short circuit, the diode PUD is provided for fixing the potential at the gate electrode. This is an effective construction when the first internal control circuit 3 includes the charge pump circuit 7. That is, if the transistor Q2 in the ON state induces the gate electrode of the transistor Q1 and the potential at the gate electrode of the transistor Q1 tends to rise, the raised gate potential of the transistor Q1 causes the induced charge to be discharged through the diode PUD, thereby preventing increase in potential at the gate electrode of the transistor Q1.

<Characteristic Function and Effect of First Preferred Embodiment>

As above described, according to the controller α1 for power devices in the first preferred embodiment of the present invention, the level shift circuit 5 including the transistors having the high breakdown voltage characteristic (for example, a breakdown voltage of not less than 800 V) causes the low potential portion using the ground potential GND as the reference potential to apply the control signal to the transistor Q1 in the high potential portion using the power supply potential $V_{CC}$ as the reference potential. This eliminates the need for provision of the insulating means employing a photocoupler and the like between the high and low potential portions, thereby increasing the responsiveness of the transistor Q1 to the control signal.

The use of the charge pump circuit as a power supply for driving various circuits in the high potential portion eliminates the need for provision of an insulated power supply for the high potential portion, achieving the size reduction of the power supply portion and the decrease in power consumption.

<Second Preferred Embodiment>

Figure 4:
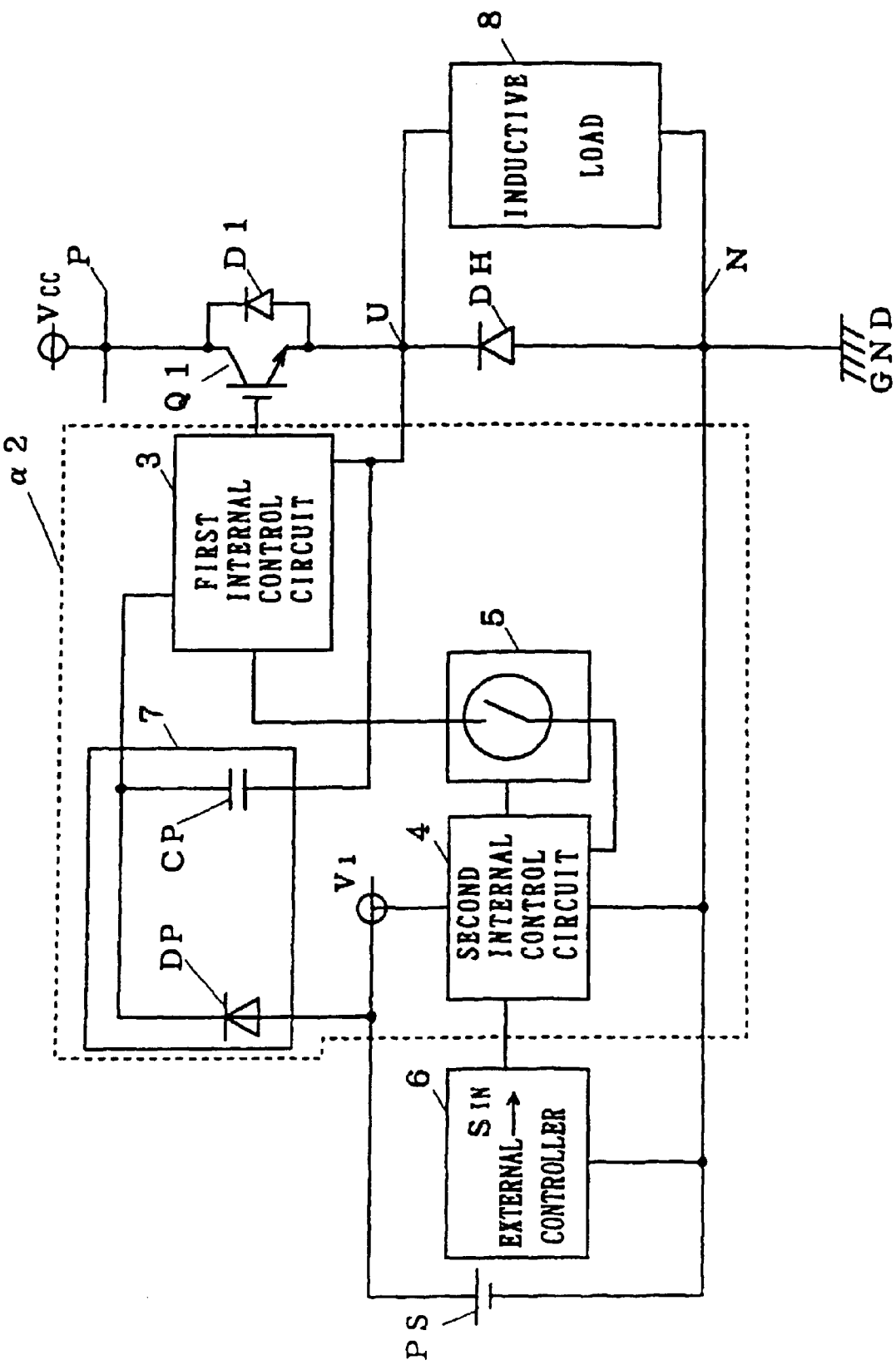
FIG. 4 illustrates the power device controller according to a second preferred embodiment of the present invention.

FIG. 4 is a circuit diagram of the power device controller according to a second preferred embodiment of the present invention. The second preferred embodiment of FIG. 4 is similar in basic construction to the first preferred embodiment shown in FIG. 1 except the differences described below. While the totem-pole connected transistors Q1 and Q2 are alternately operated for current control of the inductive load 8 in the first preferred embodiment, the second preferred embodiment comprises a diode DH, in place of the transistor Q2, having a high breakdown voltage characteristic (for example, a breakdown voltage of not less than 800 V) and connected in parallel with the inductive load 8, and a controller α2 connected to the transistor Q1.

The diode DH preferably has a breakdown voltage of about 1200 V in consideration of the overshoot voltage developed during the ON/OFF operation of the transistor Q1 where the main power supply potential is 800 V.

In such a circuit arrangement, when the transistor Q1 turns ON, the power supply potential $V_{CC}$ is applied between the connection point U and the line N, using the ground potential GND as the reference potential, and current is fed to the inductive load 8. When the transistor Q1 turns OFF, there is no potential difference between the connection point U and the line N, and the current supply to the inductive load 8 is stopped. In this manner, only the switching operation of the transistor Q1 allows current control for the inductive load 8.

The absence of the transistor Q2 in this circuit arrangement eliminates the need for the driver circuit $DR_{Q2}$ shown in FIG. 2 for driving the transistor Q2 and the need for the function of the signal transmission/reception logic circuit SD to apply the control signal $S_{Q2}$ to the transistor Q2.

<Characteristic Function and Effect of Second Preferred Embodiment>

Like the power device controller of the first preferred embodiment, the second preferred embodiment accomplishes the increased responsiveness of the power devices and the decrease in power consumption.

<Third Preferred Embodiment>

Figure 5:
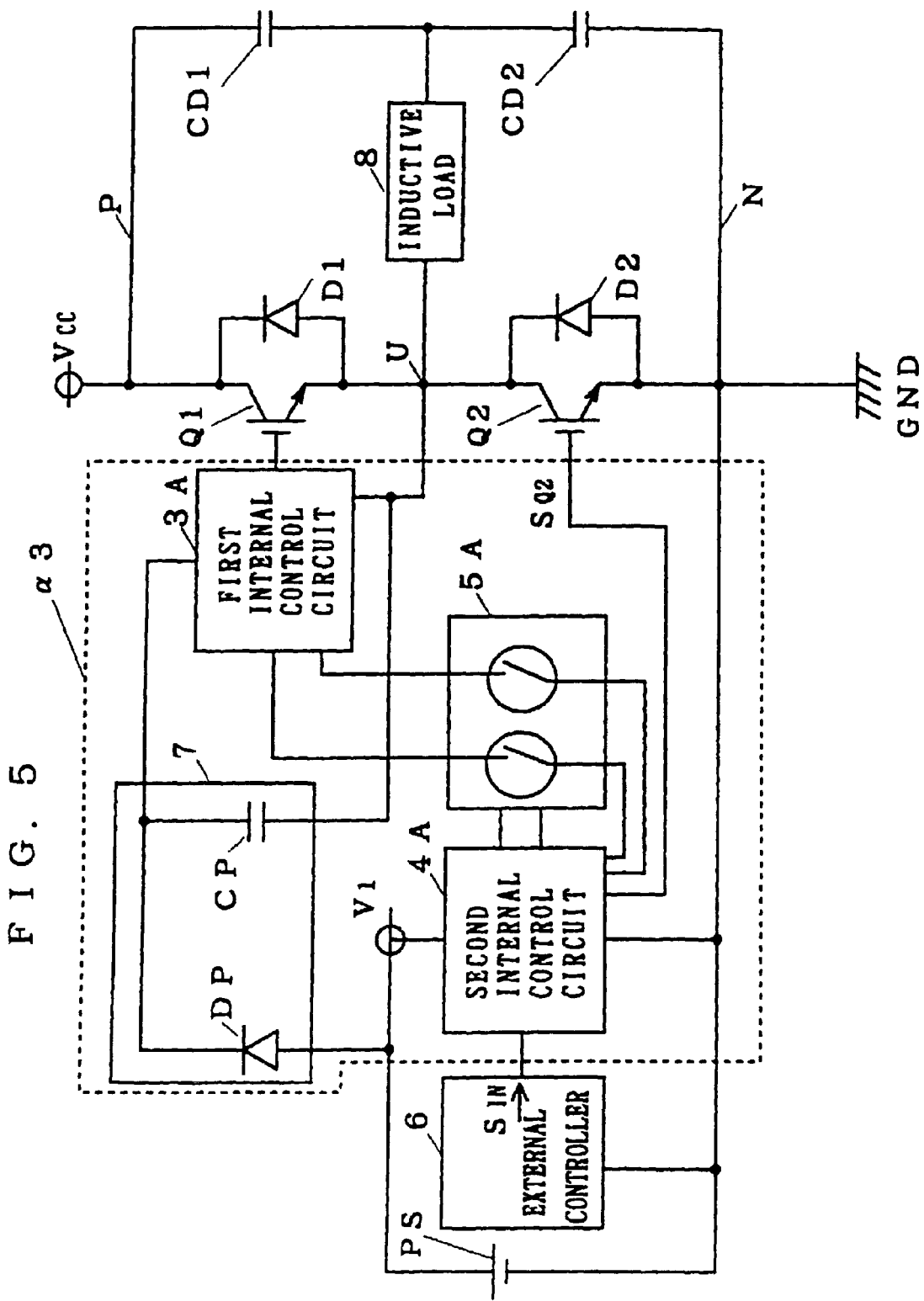
FIGS. 5 and 6 illustrate the power device controller according to a third preferred embodiment of the present invention.

FIG. 5 is a circuit diagram of the power device controller according to a third preferred embodiment of the present invention. The third preferred embodiment of FIG. 5 is similar to the first preferred embodiment in construction and operation of the transistors Q1 and Q2 between the main power supply lines P and N, and the description thereof will be omitted herein. The transistors Q1, Q2 and transistors $Q_{LV1}$, $Q_{LV2}$ to be described later are N-channel transistors.

The transistors Q1, Q2, the diode DP, and transistors $Q_{LV1}$ and $Q_{LV2}$ preferably have a breakdown voltage of about 1200 V in consideration of the overshoot voltage developed during the ON/OFF operation of the transistor Q1 where the main power supply potential is 800 V.

The construction of a controller α3 for controlling the transistors Q1 and Q2 will be discussed below. The controller α3 is connected to the external controller 6 employing a microcomputer and the like. The external controller 6 is connected to a second internal control circuit 4A which is in turn connected to a level shift circuit 5A and the gate electrode of the transistor Q2. The control power supply PS applies the voltage V1 to the second internal control circuit 4A to place the second internal control circuit 4A into operation. The reference potentials for the external controller 6, the second internal control circuit 4A and the level shift circuit 5A are the ground potential GND.

The level shift circuit 5A is connected to a first internal control circuit 3A which is in turn connected to the gate electrode of the transistor Q1. The charge pump circuit 7 is connected to the first internal control circuit 3A. The first internal control circuit 3A is connected to the connection point U so that the potential at the connection point U is the reference potential therefor. The construction and operation of the charge pump circuit 7 of the third preferred embodiment are similar to those of the first preferred embodiment, and the description thereof will be omitted herein.

Operation of the controller α3 is described below with reference to FIGS. 5 to 9. Referring to FIG. 5, the input signal $S_{IN}$ which is a pulse signal for alternately driving the transistors Q1 and Q2 for switching operation thereof is applied to the second internal control circuit 4A from the external controller 6. The second internal control circuit 4A receives the input signal $S_{IN}$ and provides control signals $S_{LV1}$ and $S_{LV2}$ for drive control of the level shift circuit 5A and applies the control signal $S_{Q2}$ to the gate electrode of the transistor Q2.

<Second Internal Control Circuit 4A>

Figure 6:
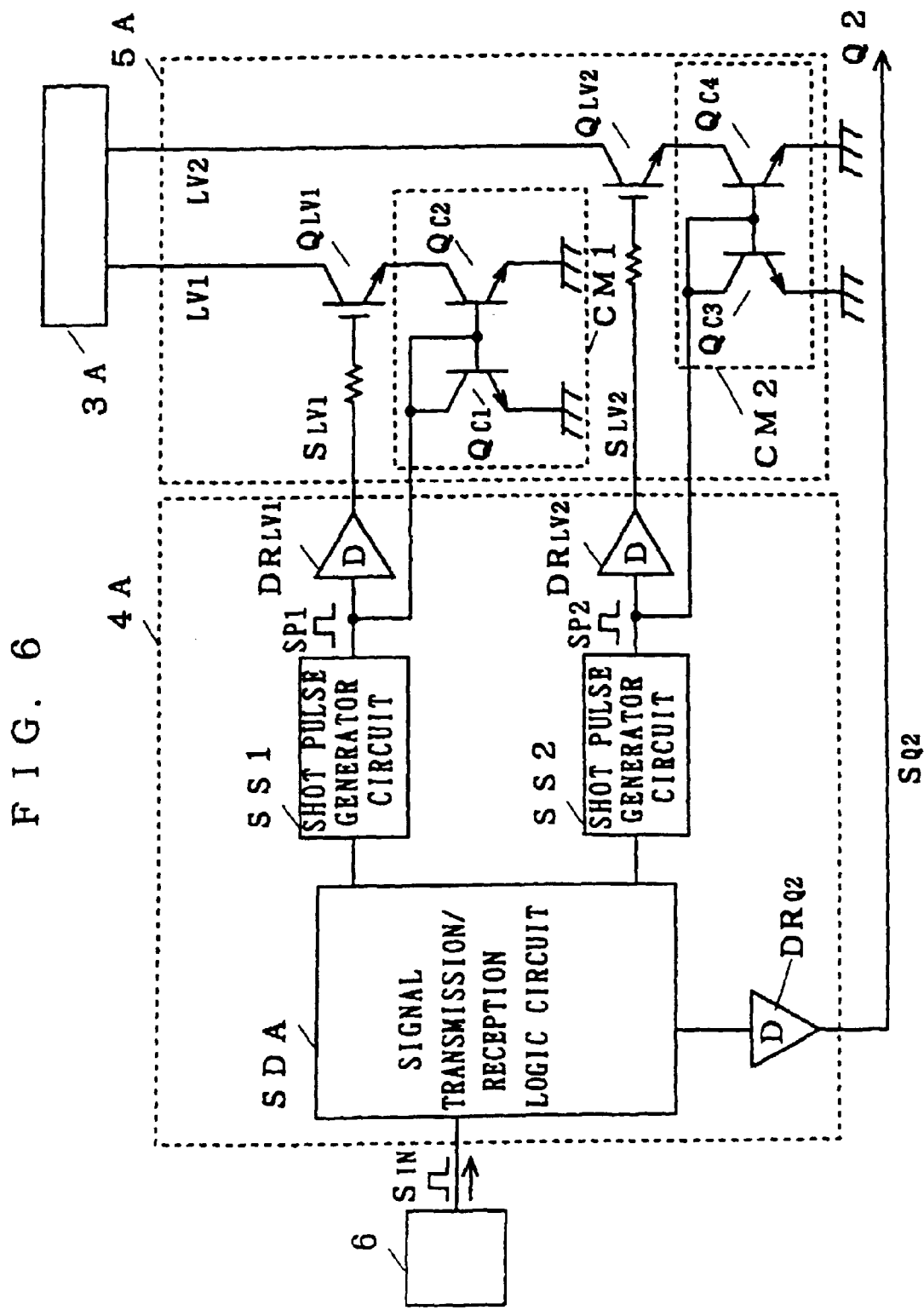

FIG. 6 is a circuit diagram of the second internal control circuit 4A and the level shift circuit 5A. Referring to FIG. 6, the second internal control circuit 4A includes a signal transmission/reception logic circuit SDA and shot pulse generator circuits SS1 and SS2. The signal transmission/reception logic circuit SDA includes a logic circuit and judges whether the entered input signal $S_{IN}$ is to be applied to the transistor Q1 or to the transistor Q2. When the input signa $S_{IN}$ is to be applied to the transistor Q1, the signal transmission/reception logic circuit SDA directs the shot pulse generator circuit SS1 or the shot pulse generator circuit SS2 to transmit a shot pulse SP1 or a shot pulse SP2 based on the input signal $S_{IN}$ to the level shift circuit 5A. The shot pulse SP1 is impressed upon the level shift circuit 5A through a driver circuit $DR_{LV1}$ in the form of the control signal $S_{LV1}$, and the shot pulse SP2 is impressed upon the level shift circuit 5A through a driver circuit $DR_{LV2}$ in the form of the control signal $S_{LV2}$.

On the other hand, when the input signal $S_{IN}$ is to be applied to the transistor Q2, the signal transmission/reception logic circuit SDA impresses the control signal $S_{Q2}$ upon the transistor Q2 through the driver circuit $DR_{Q2}$.

The reason why the input signal $S_{IN}$ is divided into the shot pulses SP1 and SP2 for transmission thereof is described below. In the first preferred embodiment, the input signal $S_{IN}$ is applied as the shot pulse SP to the driver circuit $DR_{LV}$ through which the control signal $S_{LV}$ is applied to the level shift circuit, and the transistor $Q_{LV}$ is held ON while the control signal $S_{LV}$ is maintained. In this system, when the input signal $S_{IN}$ is a long pulse of the order of from nanoseconds to seconds, the transistor $Q_{LV}$ is held ON for an accordingly long time. The high-breakdown-voltage transistor $Q_{LV}$ in the ON state passes an emitter current, with a collector-emitter voltage increased. This results in an extremely large amount of power consumption and thermal stresses upon the transistor $Q_{LV}$, which might deteriorate the characteristics of the transistor $Q_{LV}$ and shorten its life as an element in some cases.

Figure 7:
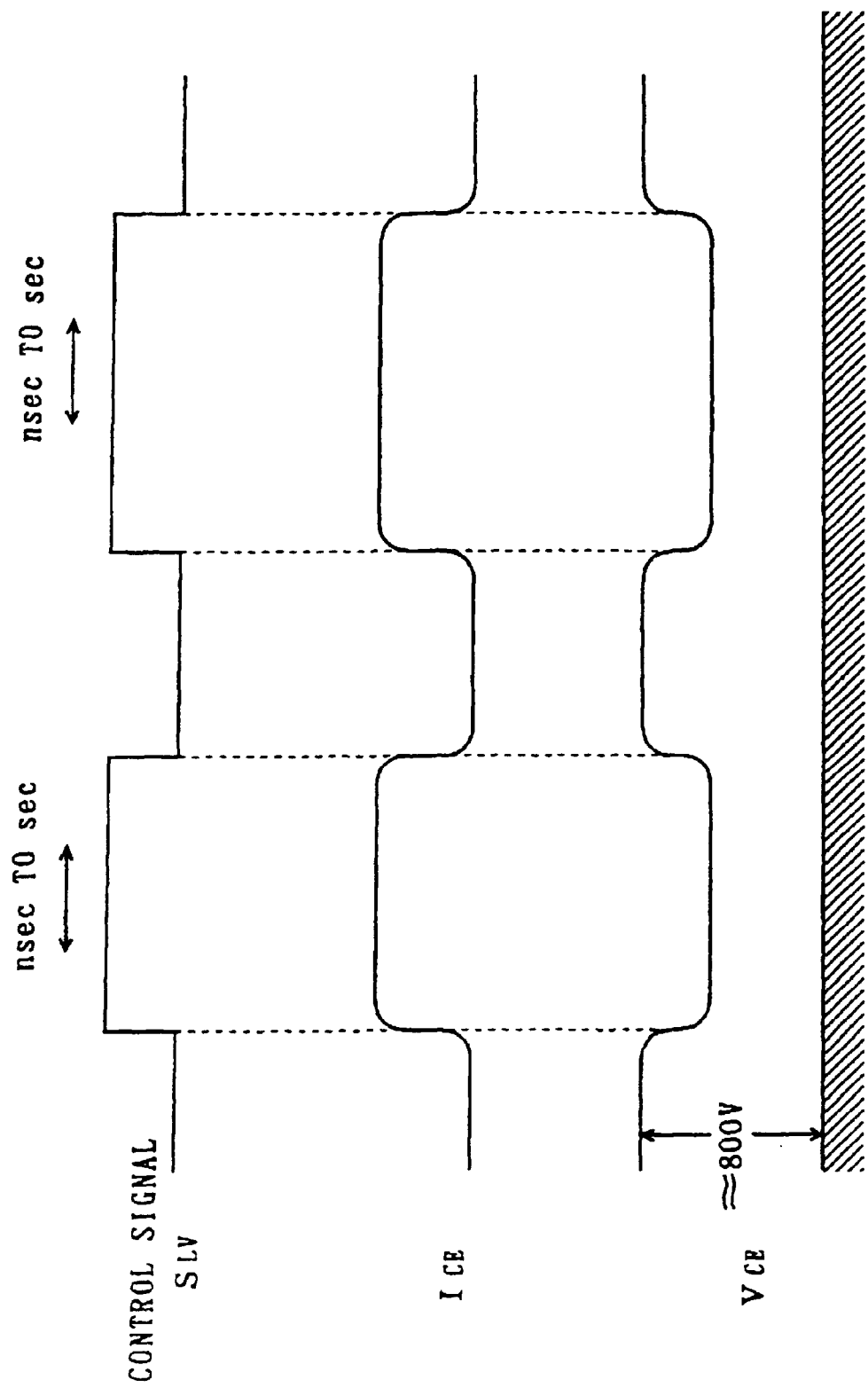
FIGS. 7 and 8 are timing charts illustrating the operation of the power device controller of the third preferred embodiment.

FIG. 7 is a timing chart of the operation of the transistor $Q_{LV}$. Referring to FIG. 7, as the control signal $S_{LV}$ entered turns ON the transistor $Q_{LV}$, a collector-emitter voltage $V_{CE}$ is slightly dropped from the power supply potential $V_{CC}$ (exactly from a potential slightly higher than the power supply potential $V_{CC}$), and a large collector-emitter current $I_{CE}$ flows. For instance, where the power supply potential $V_{CC}$ is 800 V, the collector-emitter voltage $V_{CE}$ is generally equal to 800 V, and the consumed power is the product of the collector-emitter current $I_{CE}$ and the voltage $V_{CE}$.

The second internal control circuit 4A of the third preferred embodiment detects the rising and falling edges of the long-pulse input signal $S_{IN}$ and provides the pulse signal SP1 or SP2 so as to hold the transistor $Q_{LV}$ ON for a small amount of rising and falling time.

Figure 8:
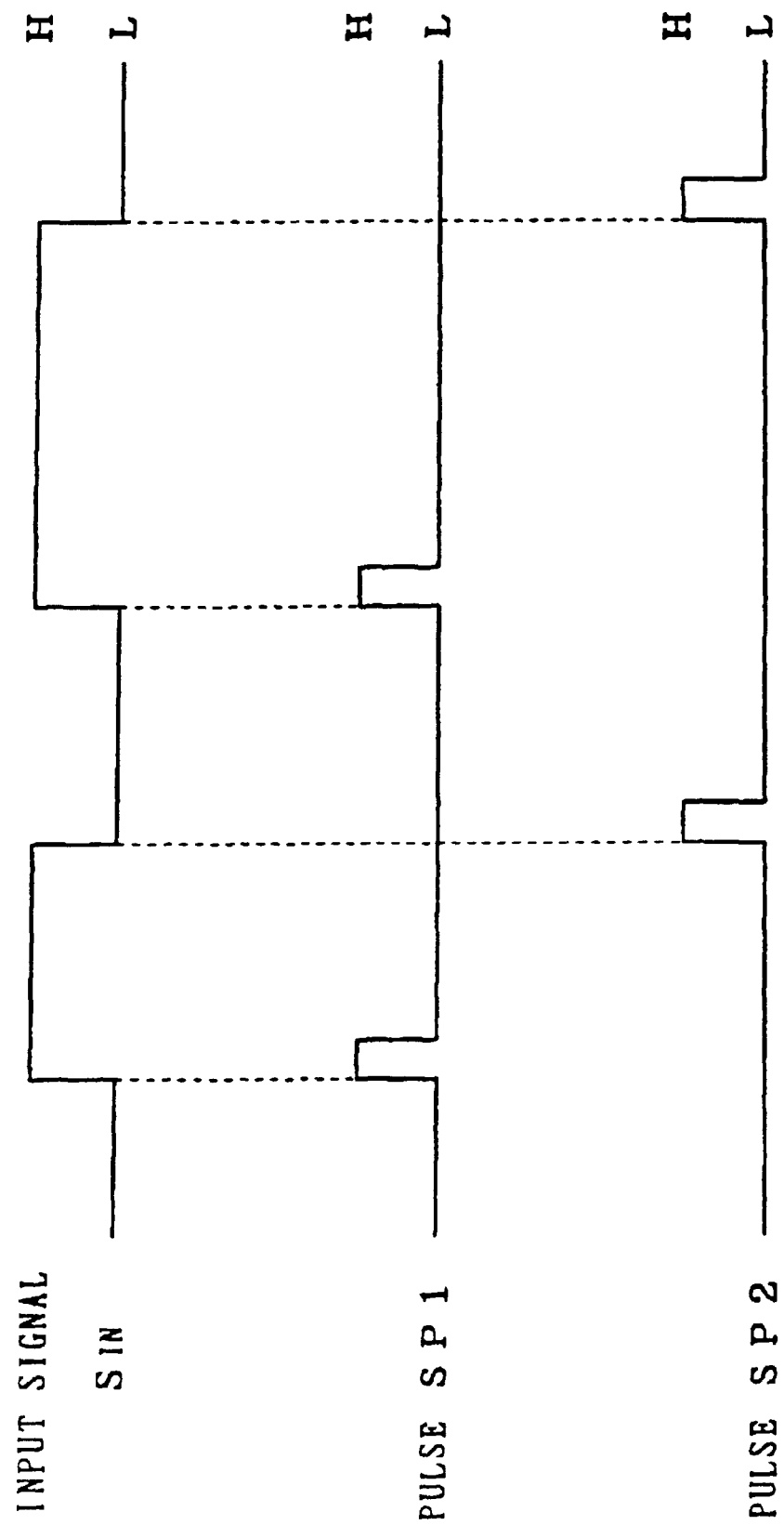

FIG. 8 is a timing chart illustrating the transmission of the shot pulses SP1 and SP2 in response to the input signal $S_{IN}$, as an example. The shot pulses SP1 and SP2 are transmitted for a small amount of time in response to the rising and falling edges of the input signal $S_{IN}$.

Referring again to FIG. 6, upon detecting the rising edge of the input signal $S_{IN}$, the signal transmission/reception logic circuit SDA causes the shot pulse generator circuit SS1 to transmit the shot pulse SP1 to the driver circuit $DR_{LV1}$ for a small amount of rising time. Upon detecting the falling edge of the input signal $S_{IN}$, the signal transmission/reception logic circuit SDA causes the shot pulse generator circuit SS2 to transmit the shot pulse SP2 to the driver circuit $DR_{LV2}$ for a small amount of falling time.

<Level Shift Circuit 5A>

With continued reference to FIG. 6, the level shift circuit 5A includes a transistor $Q_{LV1}$ receiving the control signal $S_{LV1}$ from the driver circuit $DR_{LV1}$ and having a high breakdown voltage characteristic (for example, a breakdown voltage of not less than 800 V), a current mirror circuit CM1 connected to the transistor $Q_{LV1}$, a transistor $Q_{LV2}$ receiving the control signal $S_{LV2}$ from the driver circuit $DR_{LV2}$ and having a high breakdown voltage characteristic (for example, a breakdown voltage of not less than 800 V), and a current mirror circuit CM2 connected to the transistor $Q_{LV2}$.

The current mirror circuit CM1 includes a transistor $Q_{C1}$ having connected collector and gate electrodes, and a transistor $Q_{C2}$ having a gate electrode connected to the collector electrode of the transistor $Q_{C1}$. The collector electrode of the transistor $Q_{C1}$, is connected to the shot pulse generator circuit SS1, and the collector electrode of the transistor $Q_{C2}$ is connected to the emitter electrode of the transistor $Q_{LV1}$. The current mirror circuit CM2 is similar in construction to the current mirror circuit CM1. The collector electrode of a transistor $Q_{C4}$ is connected to the emitter electrode of the transistor $Q_{LV2}$, and the collector electrode of a transistor $Q_{C3}$ is connected to the shot pulse generator circuit SS2.

In some cases, the collector electrodes of the transistors $Q_{C1}$ and $Q_{C3}$ are connected to the outputs of the driver circuits $DR_{LV1}$ and $DR_{LV2}$, respectively.

As the control signal $S_{LV1}$ from the second internal control circuit 4A turns ON the transistor $Q_{LV1}$, a level shift signal LV1 indicative of the rising edge of the input signal $S_{IN}$ is applied to the first internal control circuit 3A. As the control signal $S_{LV2}$ turns ON the transistor $Q_{LV2}$, a level shift signal LV2 indicative of the falling edge of the input signal $S_{IN}$ is applied to the first internal control circuit 3A. The level shift signals LV1 and LV2 are not simultaneously provided. It should be noted that the level shift signals LV1 and LV2 are "L" when provided. The reason for the provision of the current mirror circuits CM1 and CM2 of the third preferred embodiment is similar to that of the first preferred embodiment.

<First Internal Control Circuit 3A>

Figure 9:
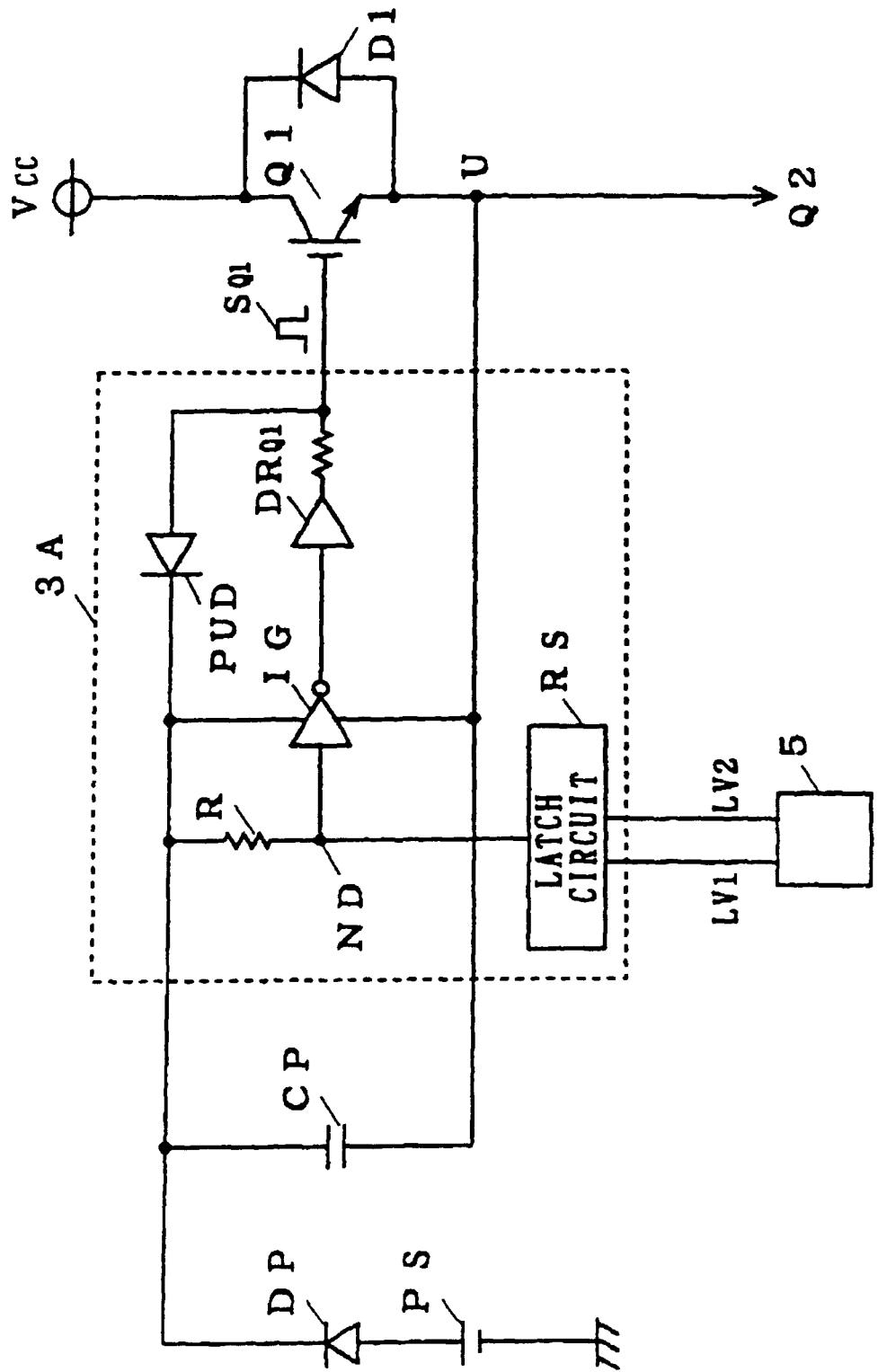
FIG. 9 illustrates the power device controller according to the third preferred embodiment of the present invention.

FIG. 9 is a circuit diagram of the first internal control circuit 3A. Referring to FIG. 9, the first internal control circuit 3A includes a latch circuit RS in addition to the inverter IG, the driver circuit $DR_{Q1}$, the resistor R, and the diode PUD which are described in the first preferred embodiment. The latch circuit RS receives the level shift signals LV1 and LV2 from the level shift circuit 5A.

On receipt of the level shift signal LV1, the latch circuit RS is set, and the potential at the connection point ND becomes "L". Then the output signal from the inverter IG which is "H" is impressed upon the driver circuit $DR_{Q1}$ through which the control signal $S_{Q1}$ which is "H" is applied to the transistor Q1, and the transistor Q1 turns ON. On receipt of the level shift signal LV2, the latch circuit RS is reset, and the transistor Q1 turns OFF. The inverter IG, the drive circuit $DR_{Q1}$, the resistor R, and the diode PUD of the third preferred embodiment are similar in operation to those of the first preferred embodiment, and the description thereof will be omitted herein.

<Characteristic Function and Effect of Third Preferred Embodiment>

In this manner, according to the power device controller of the third preferred embodiment of the present invention, the level shift circuit 5A includes the two transistors $Q_{LV1}$ and $Q_{LV2}$ having the high breakdown voltage characteristic (for example, a breakdown voltage of not less than 800 V), and if the long-pulse input signal $S_{IN}$ is given from the external controller 6, the transistors $Q_{LV1}$ and $Q_{LV2}$ are placed in operation for a small amount of time corresponding to the rising and falling edges of the input signal $S_{IN}$ to set and reset the latch circuit RS in the first internal control circuit 3A, thereby controlling the transistor Q1. There is no need to hold the level shifting transistor ON over a long period of time. This permits the level shifting transistor to be protected, accomplishing reduction in power consumption.

The third preferred embodiment also achieves the increased responsiveness of the power devices and the decrease in power consumption in the same manner as the power device controller of the first preferred embodiment.

A buffer circuit having a buffering function may be added between the latch circuit RS and the level shift circuit 5A. The provision of the buffer circuit permits impedance matching between the first internal control circuit 3A and the level shift circuit 5A, improving the transmission property of the level shift signals and the noise-insulating property.

<Fourth Preferred Embodiment>

Figure 10:
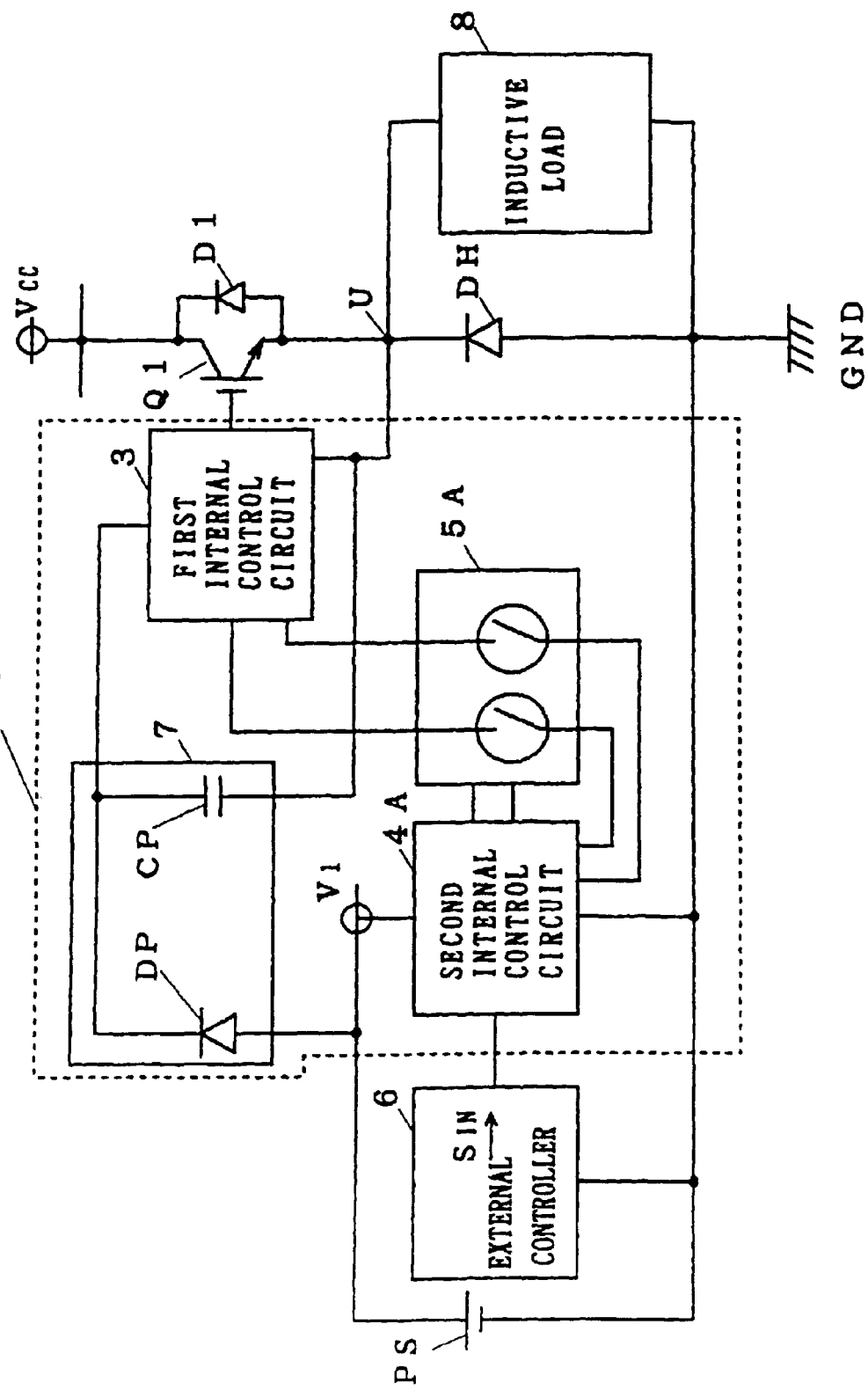
FIG. 10 illustrates the power device controller according to a fourth preferred embodiment of the present invention.

FIG. 10 is a circuit diagram of the power device controller according to a fourth preferred embodiment of the present invention. The fourth preferred embodiment of FIG. 10 is similar in basic construction to the third preferred embodiment of FIG. 5 except the differences described below. While the totem-pole connected transistors Q1 and Q2 are alternately operated for current control of the inductive load 8 in the third preferred embodiment, the fourth preferred embodiment comprises the diode DH, in place of the transistor Q2, having a high breakdown voltage characteristic (for example, a breakdown voltage of not less that 800 V) and connected in parallel with the inductive load 8, and a controller α4 connected to the transistor Q1.

The diode DH preferably has a breakdown voltage of about 1200 V in consideration of the overshoot voltage developed during the ON/OFF operation of the transistor Q1 where the main power supply potential is 800 V.

In such a circuit arrangement, when the transistor Q1 turns ON, the power supply potential $V_{CC}$ is applied between the connection point U and the line N, using the ground potential GND as the reference potential, and current is fed to the inductive load 8. When the transistor Q1 turns OFF, there is no potential difference between the connection point U and the line N, and the current supply to the inductive load 8 is stopped. In this manner, only the switching operation of the transistor Q1 allows current control for the inductive load 8.

In the circuit arrangement, the absence of the transistor Q2 eliminates the need for the driver circuit $DR_{Q2}$ of FIG. 6 for driving the transistor Q2 and the need for the function of the signal transmission/reception logic circuit SDA to apply the control signal $S_{Q2}$ to the transistor Q2.

<Characteristic Function and Effect of Fourth Preferred Embodiment>

Like the power device controller of the third preferred embodiment, the fourth preferred embodiment eliminates the need to hold the level shifting transistor ON for a long period of time to protect the level shifting transistor and reduces the power consumption. This achieves the increased responsiveness of the power devices and the decrease in power consumption.

<Fifth Preferred Embodiment>

Figure 11:
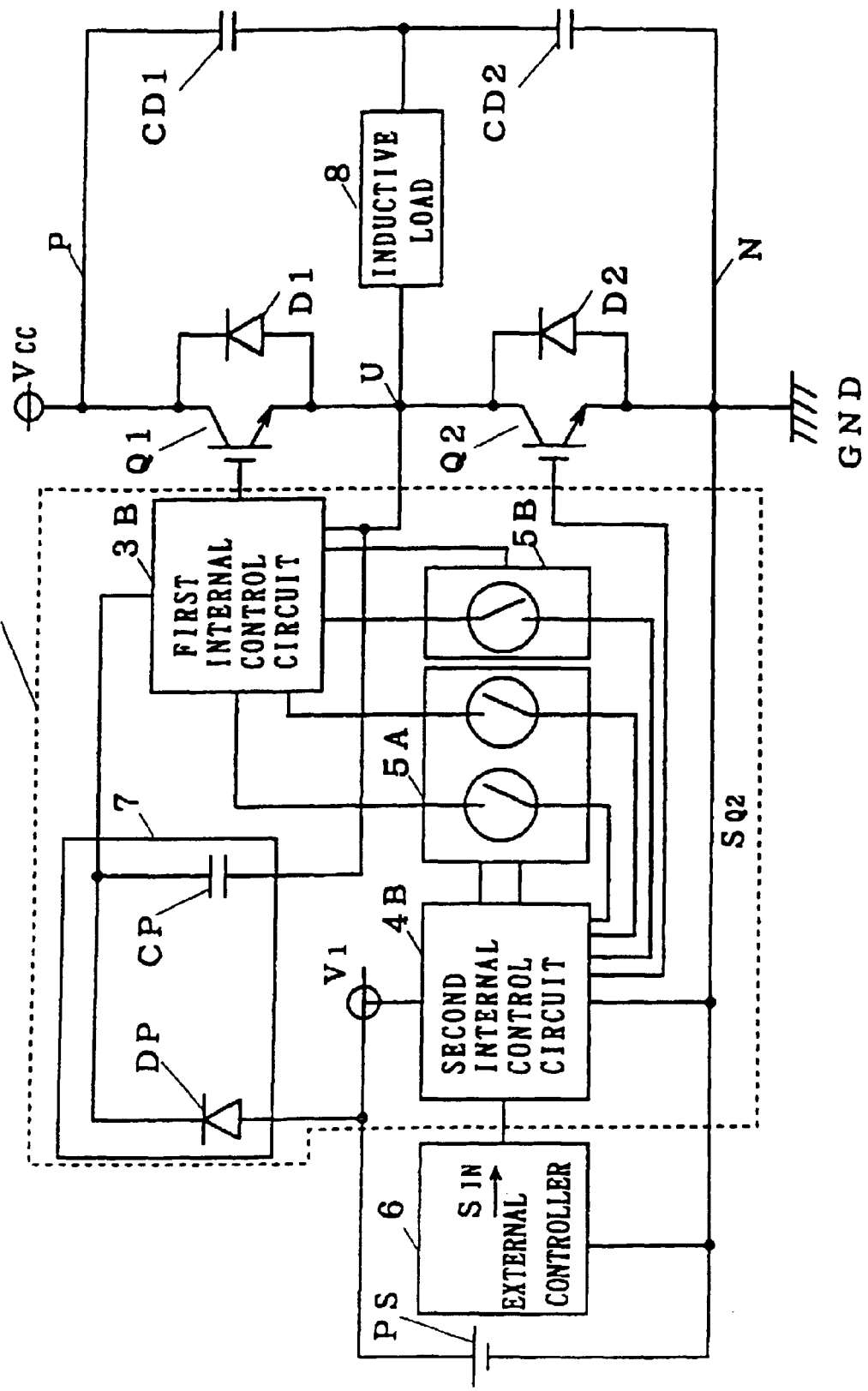
FIGS. 11 and 12 illustrate the power device controller according to a fifth preferred embodiment of the present invention.

FIG. 11 is a circuit diagram of the power device controller according to a fifth preferred embodiment of the present invention. The fifth preferred embodiment of FIG. 11 is similar to the first preferred embodiment in construction and operation of the transistors Q1 and Q2 between the main power supply lines P and N, and the description thereof will be omitted herein. The transistors Q1, Q2 and the transistors $Q_{LV1}$, $Q_{LV2}$ to be described later are N-channel transistors, and a transistor $Q_{LV3}$ to be described later is a P-channel transistor.

Description is now given on the construction of a controller α5 for controlling the transistors Q1 and Q2. The controller 5 is connected to the external controller 6 employing a microcomputer and the like. The external controller 6 is connected to a second internal control circuit 4B which is in turn connected to level shift circuits 5A, 5B and the gate electrode of the transistor Q2. The power supply voltage V1 for placing the second internal control circuit 4B into operation is applied to the second internal control circuit 4B. The reference potentials for the external controller 6, the second internal control circuit 4B, and the level shift circuits 5A, 5B are the ground potential GND.

The level shift circuits 5A and 5B are connected to a first internal control circuit 3B which is in turn connected to the gate electrode of the transistor Q1. The charge pump circuit 7 is connected to the first internal control circuit 3B. The first internal control circuit 3B is connected to the connection point U so that the potential at the connection point U is the reference potential therefor. The construction of the charge pump circuit 7 of the fifth preferred embodiment is similar to that of the first preferred embodiment, and the description thereof will be omitted herein.

Figure 12:
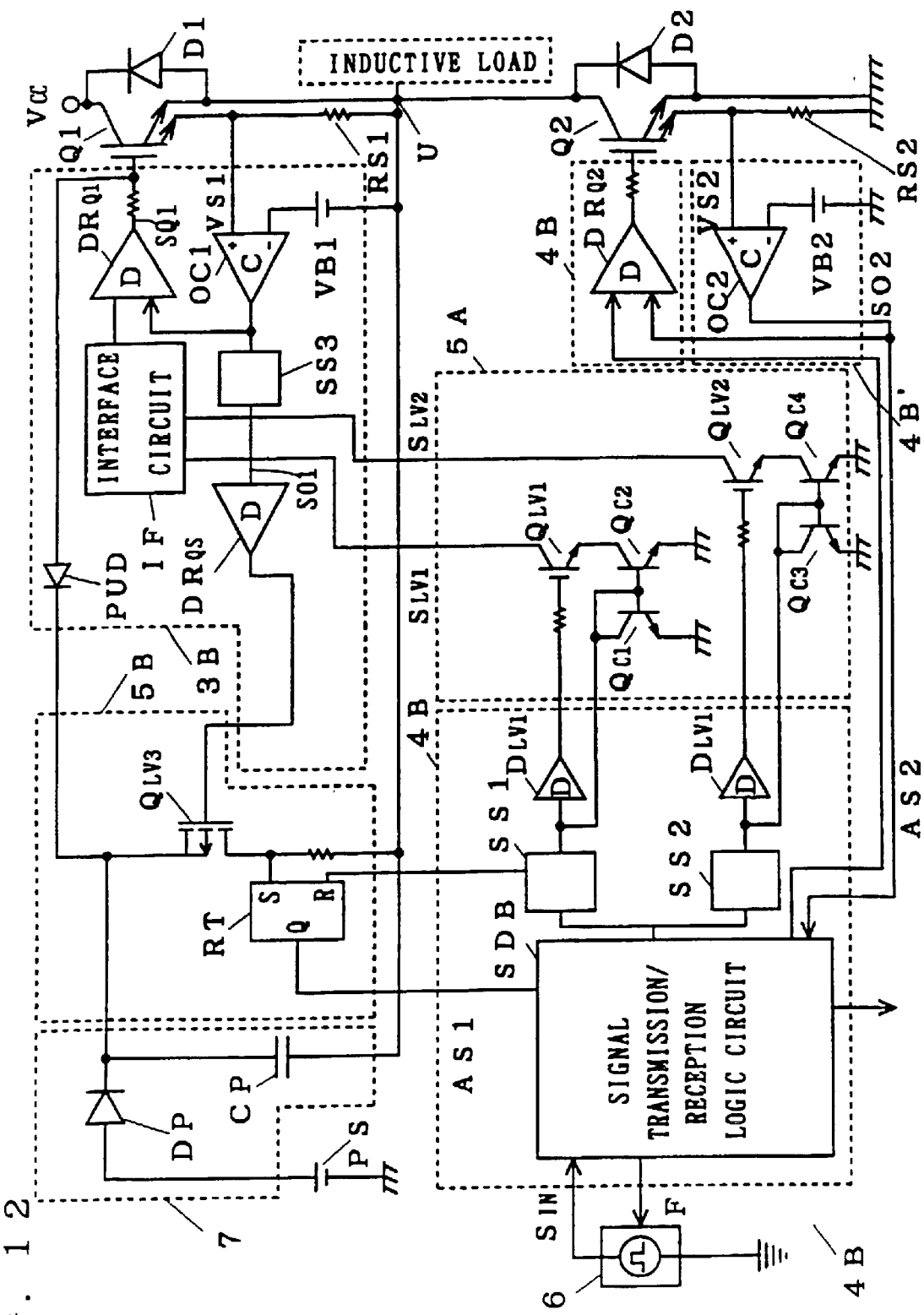

Operation of the controller α5 is described below with reference to FIG. 12. The input signal $S_{IN}$ which is the pulse signal for alternately driving the transistors Q1 and Q2 for switching operation thereof is applied to the second internal control circuit 4B from the external controller 6 as shown in FIG. 12. The second internal control circuit 4B receives the input signal $S_{IN}$ and either provides the control signals $S_{LV2}$ and $S_{LV2}$ for drive control of the level shift circuit SB or applies the control signal $S_{Q2}$ to the gate electrode of the transistor Q2. The second internal control circuit 4B receives an abnormality signal AS1 for the transistor Q1 from the first internal control circuit 3B through the level shift circuit 5B and receives an abnormality signal AS2 from the transistor Q2.

The transistors Q1, Q2, the diode DP and the transistors $Q_{LV1}$, $Q_{LV2}$, $Q_{LV3}$ to be described later preferably have a breakdown voltage of about 1200 V in consideration of the overshoot voltage developed during the ON/OFF operation of the transistor Q1 where the main power supply potential is 800 V.

<Second Internal Control Circuit 4B>

FIG. 12 is a circuit diagram of the second internal control circuit 4B, the level shift circuits 5A, 5B, and the first internal control circuit 3B. Referring to FIG. 12, the second internal control circuit 4B includes the signal transmission/reception logic circuit SDB and the shot pulse generator circuits SS1, SS2.

The signal transmission/reception logic circuit SDB is identical with the signal transmission/reception logic circuit SDA of the third preferred embodiment except that the signal transmission/reception logic circuit SDB has the function of receiving the abnormality signals AS1 and AS2 and transmitting a feedback signal F to the external controller 6, and the description of the same functions will be omitted herein.

The construction and function of the level shift circuit 5A has been discussed in the third preferred embodiment with reference to FIG. 6, and the description thereof is omitted herein.

<First Internal Control Circuit 3B>

With continued reference to FIG. 12, the control signals $S_{LV1}$, $S_{LV2}$ from the level shift circuit 5A are impressed upon the first internal control circuit 3B. The first internal control circuit 3B is constructed such that a means for detecting an abnormal condition in the transistor Q1 is added to the first internal control circuit 3A described in the third preferred embodiment with reference to FIG. 9. The same construction as the first internal control circuit 3A described with reference to FIG. 9 is represented as an interface circuit IF in FIG. 12.

An example of the means for detecting an abnormal condition in the transistor Q1 is such that a resistor RS1 is connected between the sense electrode of the transistor Q1 and the connection point U and current through the sense electrode is converted into a sense voltage VS1 which is then applied to a non-inverting input terminal of an overcurrent protective circuit OC1 comprised of a comparator. The overcurrent protective circuit OC1 receives a reference voltage VB1 at its inverting input terminal, and a shot pulse generator circuit SS3 converts the output from the overcurrent protective circuit OC1 into a pulse to apply the pulse as an overcurrent detection signal SO1 to a driver circuit $DR_{QS}$. The output from the overcurrent protective circuit OC1 which is not converted into the pulse is also applied to the driver circuit $DR_{Q1}$ which in turn controls the operation of the transistor Q1 to cancel the abnormal condition.

Specifically, the driver circuit $DR_{Q1}$, on receipt of the overcurrent detection signal SO1, interrupts the control signal $S_{Q1}$ to be outputted to the gate electrode of the transistor Q1 to turn OFF the transistor Q1.

The driver circuit $DR_{QS}$ is a circuit for driving the level shift circuit 5B which feeds back the abnormal condition generated in the transistor Q1 to the external controller 6 in the low potential portion. Upon receipt of the overcurrent detection signal SO1, the driver circuit $DR_{QS}$ puts the transistor $Q_{LV3}$ forming the level shift circuit 5B into operation.

Means for detecting an abnormal condition in the transistors Q1, Q2 may be an overvoltage detection process or an abnormal temperature detection process for the transistors Q1, Q2. These processes may be used in parallel combination. In this case, the detection means are connected to the driver circuit $DR_{QS}$ through an OR circuit or an NOR circuit.

<Level Shift Circuit 5B>

The level shift circuit 5B includes a latch circuit RT and the transistor $Q_{LV3}$ having a high breakdown voltage characteristic (for example, a breakdown voltage of not less than 800 V). The driver circuit $DR_{QS}$ is connected to the gate electrode of the transistor $Q_{LV3}$. The source electrode of the transistor $Q_{LV3}$ is connected to the negative electrode of the diode DP of the charge pump circuit 7, and the drain electrode of the transistor $Q_{LV3}$ is connected to the potential at the connection point U.

The latch circuit RT is comprised of, for example, an RS flip-flop circuit having a set input S connected to the drain electrode of the transistor $Q_{LV3}$, a reset input R connected to the shot pulse generator circuit SS1, and an output Q providing the abnormality signal AS1 to the signal transmission/reception logic circuit SDB.

The signal transmission/reception logic circuit SDB functions to receive the level-shifted abnormality signal AS1 and transmit the feedback signal F to the external controller 6 to indicate the abnormal condition in the transistor Q1.

A construction for detecting an abnormal condition in the transistor Q2 is shown in FIG. 12 as an abnormality detector circuit 4B'. This construction is fundamentally similar to the construction of the abnormal condition detecting means for the transistor Q1 and is such that a resistor RS2 is connected between the sense electrode of the transistor Q2 and the ground potential and current through the sense electrode is converted into a sense voltage VS2 which is then impressed upon an non-inverting input terminal of an overcurrent protective circuit OC2 comprised of a comparator. The overcurrent protective circuit OC2 receives a reference voltage VB2 at its inverting input terminal, and the output from the overcurrent protective circuit OC2 is applied as an overcurrent detection signal SO2 to the driver circuit $DR_{Q2}$ and the signal transmission/reception logic circuit SDB.

Upon receipt of the overcurrent detection signal SO2, the driver circuit $DR_{Q2}$ interrupts the control signal $S_{Q2}$ to be outputted to the gate electrode of the transistor Q2 to turn OFF the transistor Q2.

The overcurrent detection signal SO2 is applied to the signal transmission/reception logic circuit SDB in the form of the abnormality signal AS2. The signal transmission/reception logic circuit SDB functions to transmit the feedback signal F to the external controller 6 to indicate the abnormal condition in the transistor Q2.

<Characteristic Function and Effect of Fifth Preferred Embodiment>

As above stated, the power device controller of the fifth preferred embodiment of the present invention is adapted to detect the abnormal condition in the transistor Q1 in the high potential portion and then turn OFF the transistor Q1, thus preventing the breakdown of the transistor Q1 due to the sustained abnormal condition. The abnormal condition in the transistor Q1 is transmitted through the level shift circuit 5B including the P-channel transistor $Q_{LV3}$ having the high breakdown voltage characteristic to the second internal control circuit 4B in the low potential portion and is then fed back from the second internal control circuit 4B to the external controller 6, whereby the abnormal condition in the transistor Q1 is indicated. Further, the abnormal condition in the transistor Q2 is also detected and then the transistor Q2 is turned OFF, whereby the breakdown of the transistor Q2 is prevented.

<Sixth Preferred Embodiment>

Figure 13:
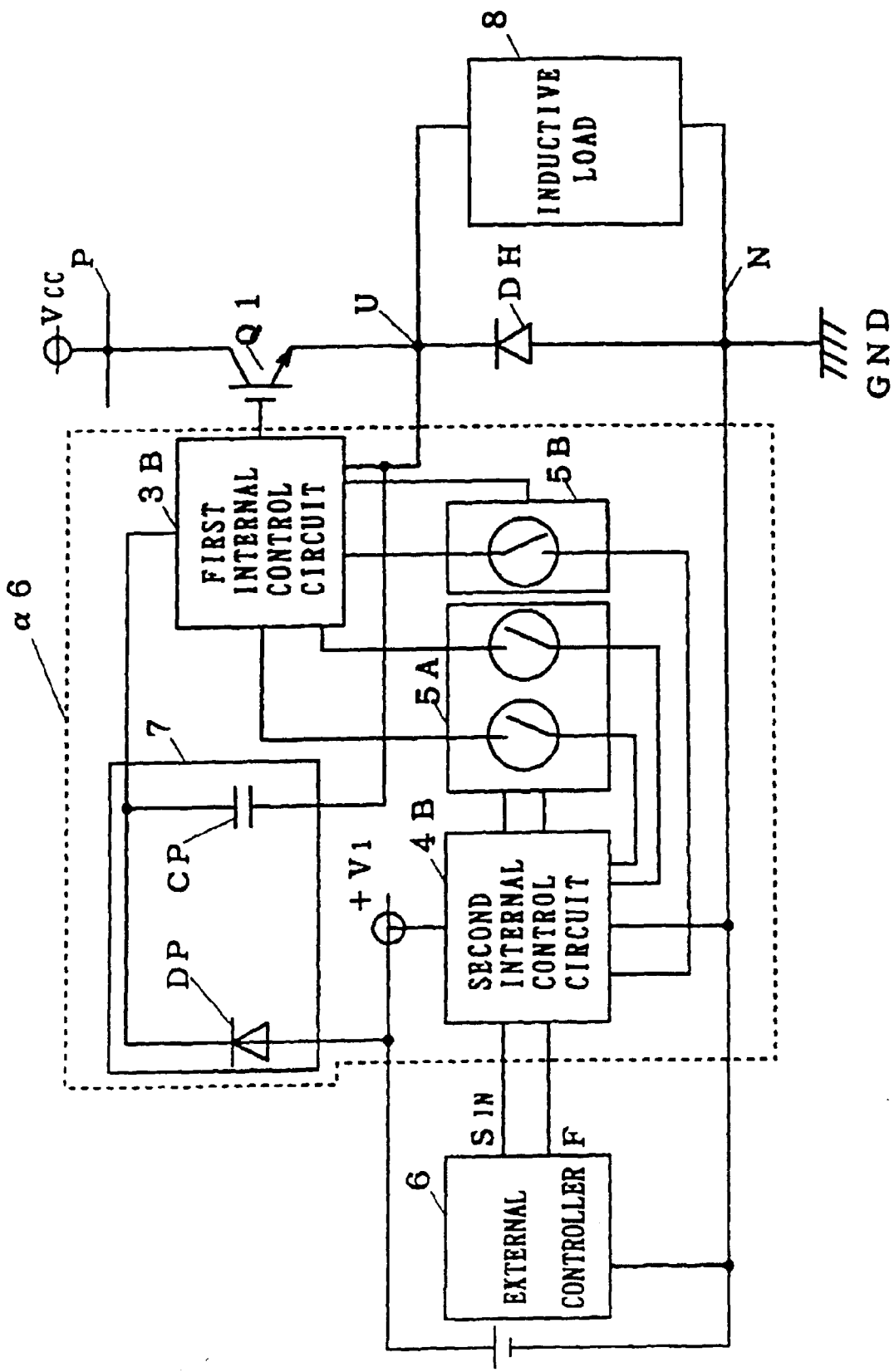
FIG. 13 illustrates the power device controller according to a sixth preferred embodiment of the present invention.

FIG. 13 is a circuit diagram of the power device controller according to a sixth preferred embodiment of the present invention. The sixth preferred embodiment of FIG. 13 is similar in basic construction to the fifth preferred embodiment of FIG. 11 except the differences described below. While the totem-pole connected transistors Q1 and Q2 are alternately operated for current control of the inductive load 8 in the fifth preferred embodiment, the sixth preferred embodiment comprises the diode DH, in place of the transistor Q2, having a high breakdown voltage characteristic (for example, a breakdown voltage of not less that 800 V) and connected in parallel with the inductive load 8, and a controller α6 connected to the transistor Q1.

The diode DH preferably has a breakdown voltage of about 1200 V in consideration of the overshoot voltage developed during the ON/OFF operation of the transistor Q1 where the main power supply potential is 800 V.

In such a circuit arrangement, when the transistor Q1 turns ON, the power supply potential $V_{CC}$ is applied between the connection point U and the line N, using the ground potential GND as the reference potential, and current is fed to the inductive load 8. When the transistor Q1 turns OFF, there is no potential difference between the connection point U and the line N, and the current supply to the inductive load 8 is stopped. In this manner, only the switching operation of the transistor Q1 allows the current control for the inductive load 8.

The absence of the transistor Q2 in this circuit arrangement eliminates the need for the driver circuit $DR_{Q2}$ of FIG. 12 for driving the transistor Q2 and the need for the function of the signal transmission/reception logic circuit SDB to apply the control signal $S_{Q2}$ to the transistor Q2. Also unnecessary are the resistor RS2, overcurrent protective circuit OC2 and reference voltage source VB2 for detection of the abnormal current in the transistor Q2.

<Characteristic Function and Effect of Sixth Preferred Embodiment>

Like the fifth preferred embodiment, the power device controller of the sixth preferred embodiment of the present invention is adapted to detect the abnormal condition in the transistor Q1 in the high potential portion and then turn OFF the transistor Q1, preventing the breakdown of the transistor Q1 due to the sustained abnormal condition. The abnormal condition in the transistor Q1 is transmitted through the level shift circuit 5B including the P-channel transistor $Q_{LV3}$ having the high breakdown voltage characteristic to the second internal control circuit 4B in the low potential portion and is then fed back from the second internal control circuit 4B to the external controller 6, whereby the abnormal condition in the transistor Q1 is indicated.

According to the power device controller of the first to sixth preferred embodiments of the present invention, the application of the control signal to the transistor Q1 in the high potential portion from the external controller 6 in the low potential portion or the feedback of the signal indicative of the operating condition of the transistor Q1 to the external controller 6 is carried out such that the control signal or the feedback signal is transmitted and received through the level shift circuit employing the transistor having the high breakdown voltage characteristic (for example, a breakdown voltage of not less than 800 V). This eliminates the need for particular insulating elements such as photocouplers and permits the transistor Q1 to be driven by using the charge pump circuit. Therefore, individual power supplies in the high and low potential portions are not required but the single power supply can actuate the high and low potential portions.

<Seventh Preferred Embodiment>
<Addition of Analog Current Detector Circuit>

Figure 14:
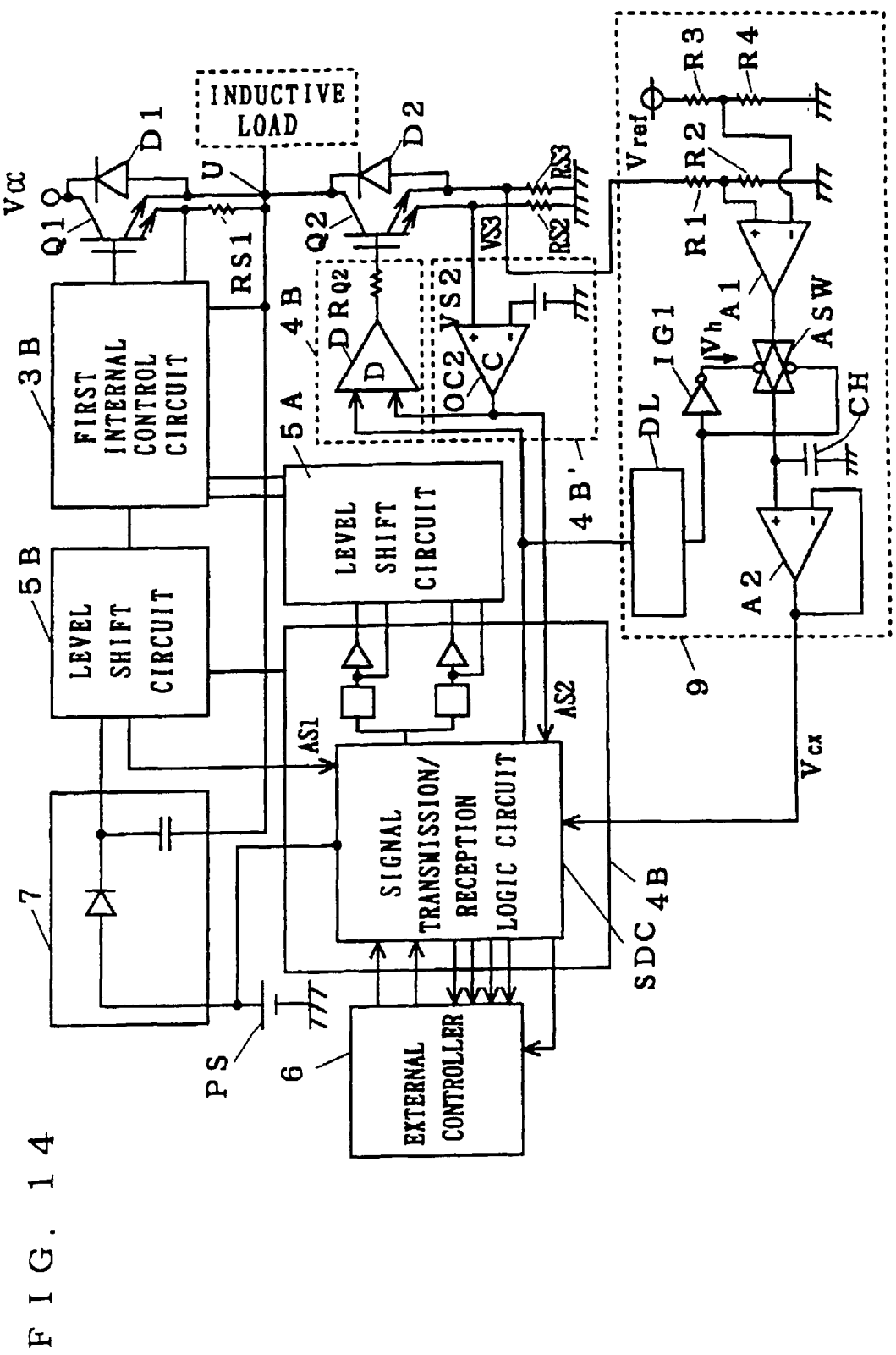
FIG. 14 illustrates the power device controller according to a seventh preferred embodiment of the present invention.

FIG. 14 is a circuit diagram of the power device controller having a protective device according to a seventh preferred embodiment of the present invention. Referring to FIG. 14, a controller α7 comprises an analog current detector circuit 9 serving as a protective device. A resistor RS3 is connected between the drain electrode of the transistor Q2 and the ground potential, and the drain electrode of the transistor Q2 is connected to the analog current detector circuit 9. Other constructions of the controller α7 are similar to those of the controller α5 described with reference to FIG. 12 except that a signal transmission/reception logic circuit SDC functions to process an output signal from the analog current detector circuit 9.

The analog current detector circuit 9 comprises an amplifier circuit A1 receiving and amplifying a voltage VS3 obtained by the current-to-voltage conversion in the resistor RS3 between the drain electrode of the transistor Q2 and the ground potential; a capacitor CH in a later stage of the amplifier circuit A1 between the amplifier circuit A1 and the ground potential; an amplifier circuit A2 serving as a voltage buffer; an analog switch ASW (gate element) between the amplifier circuit A1 and the amplifier circuit A2; and a delay circuit DL for adding a time delay to a hold signal $V_h$ operating the analog switch ASW in response to a signal $V_i$ applied to the driver circuit $DR_{Q2}$. A non-inverting input terminal of the amplifier circuit A1 is connected to a voltage-divider circuit consisting of in-series connected resistors R1 and R2 for dividing the sense voltage VS2. An inverting input terminal of the amplifier circuit A1 is connected to a voltage-divider circuit consisting of in-series connected resistors R3 and R4 for dividing a comparison voltage $V_{Ref}$. The amplifier circuit A1 amplifies the voltage VS2 to provide $V_{Ref}$–VS2×R2/R1.

Figure 15:
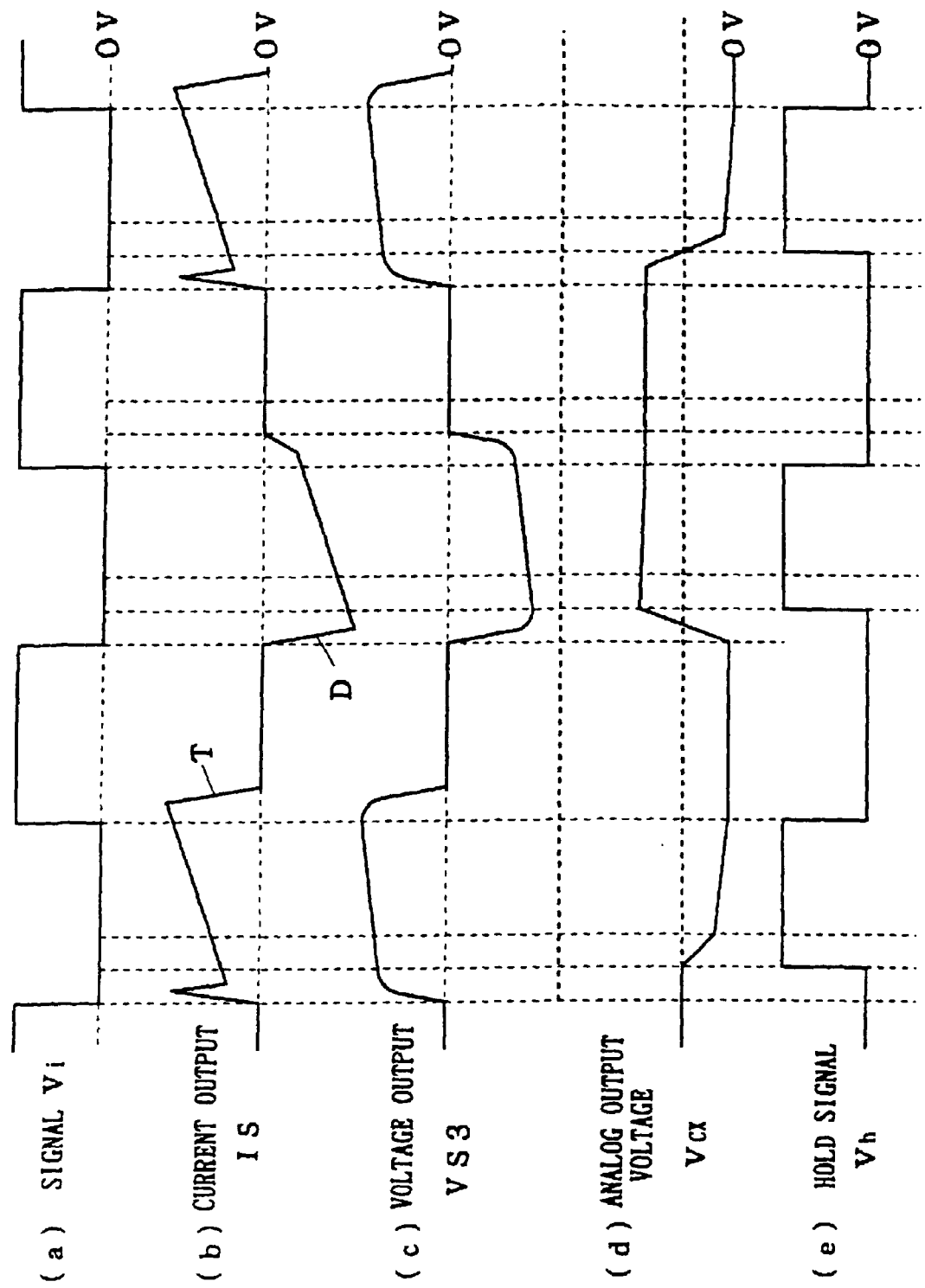
FIGS. 15A to 15E are timing charts illustrating the operation of the power device controller of the seventh preferred embodiment.

Operation will be described with reference to FIGS. 15A to 15E. FIGS. 15A to 15E are timing charts illustrating the operation of the analog current detector circuit 9. The signal $V_i$ as a pulse signal is applied to the driver circuit $DR_{Q2}$ from the signal transmission/reception logic circuit SDC (FIG. 15A). A current output IS from the transistor Q2 and diode D2 operated in response to the signal $V_i$ indicates that current flows alternately to the transistor Q2 and to the diode D2 (FIG. 15B). Referring to FIG. 15B, the waveform having a sharp current peak at the rising edge indicates a transistor current through the transistor Q2, and the waveform developing in the opposite direction from the transistor current indicates a diode current through the diode D2 connected in inverse-parallel with the transistor Q2.

The timing chart of the voltage output VS3 into which the resistor RS3 converts the current output IS is shown in FIG. 15C. Electrical charge and discharge of the capacitor CH are used so as to make the voltage output VS3 into a near-analog form. The current value exhibits a protrusion at the rising edge of the transistor current T because of an abrupt current change during recovery as shown in FIG. 15B. Although not shown, noises and the like are added at the rising edge, and it is thus disadvantageous to use the transistor current T at the rising edge as a signal.

To prevent the use of the transistor current T at the rising edge as shown in FIG. 15B, the hold signal $V_h$ is applied with a time delay corresponding to the rising edge of the voltage output VS3 (FIG. 15E).

The analog switch ASW is opened and closed by the hold signal $V_h$ having a time delay provided by the delay circuit DL and given through an inverter IG1. When application of the hold signal $V_h$ turns ON the analog switch ASW, the capacitor CH follows an amplified sense voltage signal and is discharged. When the absence of the hold signal $V_h$ turns OFF the analog switch ASW, the capacitor CH is charged and held, and a voltage at the time when the hold signal $V_h$ is exhausted is maintained. The amplifier circuit A2 functions as a voltage buffer and outputs the amplified sense voltage signal as an analog output voltage $V_{cx}$ (FIG. 15D). As shown in FIG. 15D, the analog output voltage $V_{cx}$ exhibits a near-analog form and is applied to the signal transmission/reception logic circuit SDC as an analog current output from the transistor Q2 and diode D2.

The analog current is used as a signal directly indicative of the operating conditions of the inverter circuit and has been detected by a shunt resistor connected to the output of the inverter circuit. The shunt resistor has a non-negligibly large area relative to the device, and the signal detected by the shunt resistor is required to be applied to the external controller 6 through an insulating element such as a photocoupler, resulting in slow response. In the seventh preferred embodiment, however, the analog current is obtained without the shunt resistor and insulating element.

<Characteristic Function and Effect of Seventh Preferred Embodiment>

According to the power device controller of the seventh preferred embodiment of the present invention, the current through the transistor Q2 is directly detected and is then applied to the external controller 6 without passing through insulating elements such as photocouplers. The current through the transistor Q2 is detected in real time. For example, where the set value of the overcurrent for the transistor Q2 is two and a half times the normal current, an overcurrent warning signal may be applied to the external controller 6 when the overcurrent becomes twice the normal current, thereby preventing the overcurrent conditions. Such a function is obtained by detecting the current through the transistor Q2 in real time.

<Eighth Preferred Embodiment>
<Addition of Temperature Abnormality Detector Circuit and Power Supply Voltage Abnormality Detector Circuit>

Figure 16:
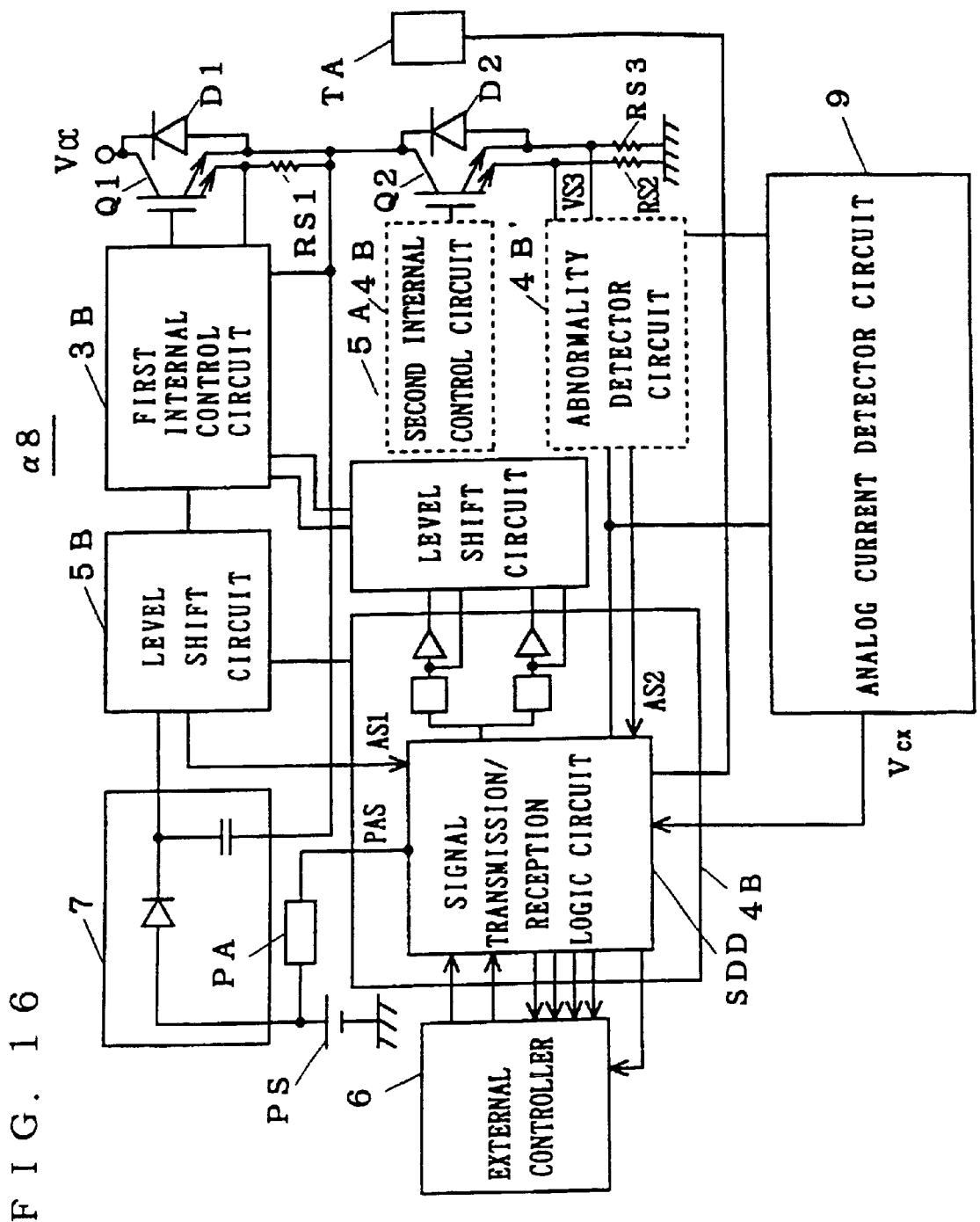
FIGS. 16 and 17 illustrate the power device controller according to an eighth preferred embodiment of the present invention.

FIG. 16 is a circuit diagram of the power device controller with the protective device according to an eighth preferred embodiment of the present invention. A controller α8 of FIG. 16 is constructed such that a temperature abnormality detector circuit TA and a power supply voltage abnormality detector circuit PA as protective devices are added to the controller α7 described with reference to FIG. 14. Other constructions of the controller α8 are similar to those of the controller α7 described with reference to FIG. 14 except that a signal transmission/reception logic circuit SDD functions to process output signals from the temperature abnormality detector circuit TA and from the power supply voltage abnormality detector circuit PA.

Referring to FIG. 16, the control power supply PS for controlling the transistors Q1 and Q2 is connected to the power supply voltage abnormality detector circuit PA for detecting an abnormality in the power supply voltage. The power supply voltage abnormality detector circuit PA outputs a predetermined power supply voltage abnormality detection signal PAS if the voltage value at the control power supply PS is higher or lower than a preset value. The power supply voltage abnormality detection signal PAS is applied to the signal transmission/reception logic circuit SDD.

With continued reference to FIG. 16, the temperature abnormality detector circuit TA is provided adjacent the transistor Q2. The temperature abnormality detector circuit TA detects the temperature of the transistor Q2 to detects an abnormal operation of the transistor Q2 by using the temperature. The temperature abnormality detector circuit TA outputs a predetermined temperature abnormality detection signal TAS if the temperature of the transistor Q2 is higher than a preset value The temperature abnormality detection signal TAS is applied to the signal transmission/reception logic circuit SDD.

The signal transmission/reception logic circuit SDD receives the abnormality signals AS1 and AS2 indicative of the abnormal conditions in the transistors Q1 and Q2 in the same manner as in the fifth preferred embodiment described with reference to FIG. 12, and the analog output voltage $V_{cx}$ from the analog current detector circuit 9 in the same manner as in the seventh preferred embodiment described with reference to FIG. 14 as well as the temperature abnormality detection signal TAS from the temperature abnormality detector circuit TA and the power supply voltage abnormality detection signal PAS from the power supply voltage abnormality detector circuit PA.

Figure 17:
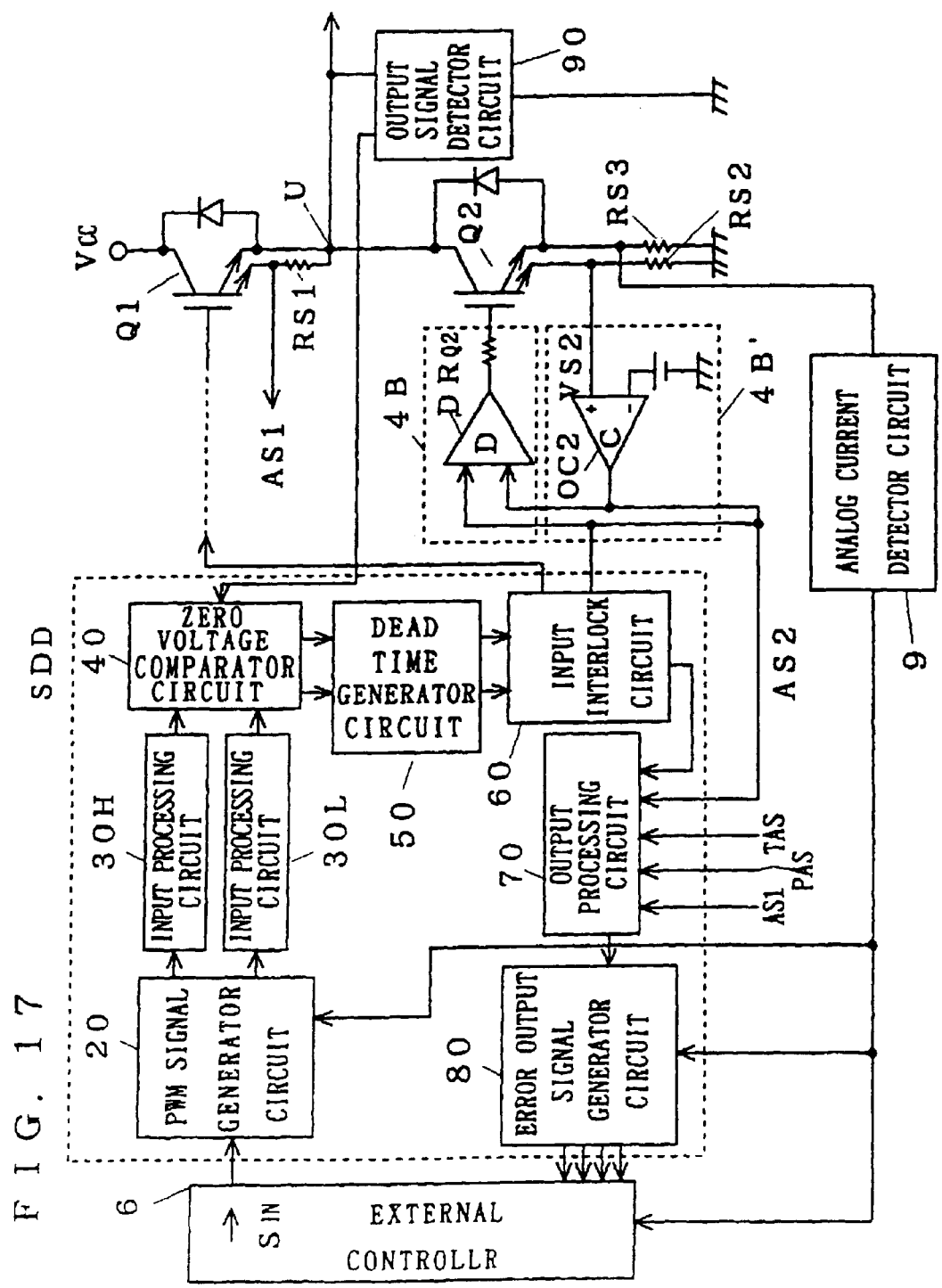

The construction of the signal transmission/reception logic circuit SDD will be described below with reference to FIG. 17. The signal transmission/reception logic circuit SDD receives the input signal from the external controller 6, outputs the signals for controlling the transistors Q1 and Q2, and feeds back the abnormality signals detected by the protective circuits to the external controller 6.

A PWM (Pulse Width Modulation) signal generator circuit 20 converts the input signal $S_{IN}$ from the external controller 6 into PWM signals including a signal to be applied to the transistor in the high potential portion (the transistor Q1 herein) and a signal to be applied to the transistor in the low potential portion (the transistor Q2 herein) which are impressed upon input processing circuits 30H and 30L, respectively.

The PWM signals from the PWM signal generator circuit 20 are normally applied so that one of the transistor in the high potential portion and the transistor in the low potential portion turns ON. After turning OFF, practical transistors carry the collector current for a constant period of time because of the accumulation of carriers. If one of the transistor turns ON simultaneously with the other transistor turning OFF, a short circuit occurs between the lines P and N, resulting in a great amount of stresses upon both of the transistors which may cause their life to be shortened. To prevent such a short circuit between the lines P and N, a dead time generator circuit 50 establishes a time dead Td for making the ON signal at the rising edge to lag behind by a predetermined time.

The presence of the time dead Td produces distortions in the output voltage from the inverter circuit, increased higher-harmonic current, and pulsating torque, thus placing the inductive load connected to the inverter circuit into unstable operation. In particular, a high switching frequency (carrier frequency) of the PWM signals non-negligibly influences the output voltage from and current through the inverter circuit. For correction of the time dead Td, there is provided an output signal detector circuit 90 for detecting a voltage at the output portion (the connection point U herein) of the inverter circuit in the form of a digital signal, and a zero voltage comparator circuit 40 compares the voltage at the output portion of the inverter circuit with the PWM signals to output an ON/OFF signal for the transistors when the time integration of the deviations of the voltage at the output portion of the inverter circuit from the PWM signals becomes zero, thereby operating the transistors with the corrected time dead Td.

An input interlock circuit 60 detects the timing of the PWM signals with the corrected time dead Td to be applied to the transistors in the high and low potential portions. For instance, when the PWM signals to be applied to the transistors in the high and low potential portions are both "low" at the same time, the input interlock circuit 60 impresses a simultaneous input detection signal DAS upon an output processing circuit 70.

Figure 18:
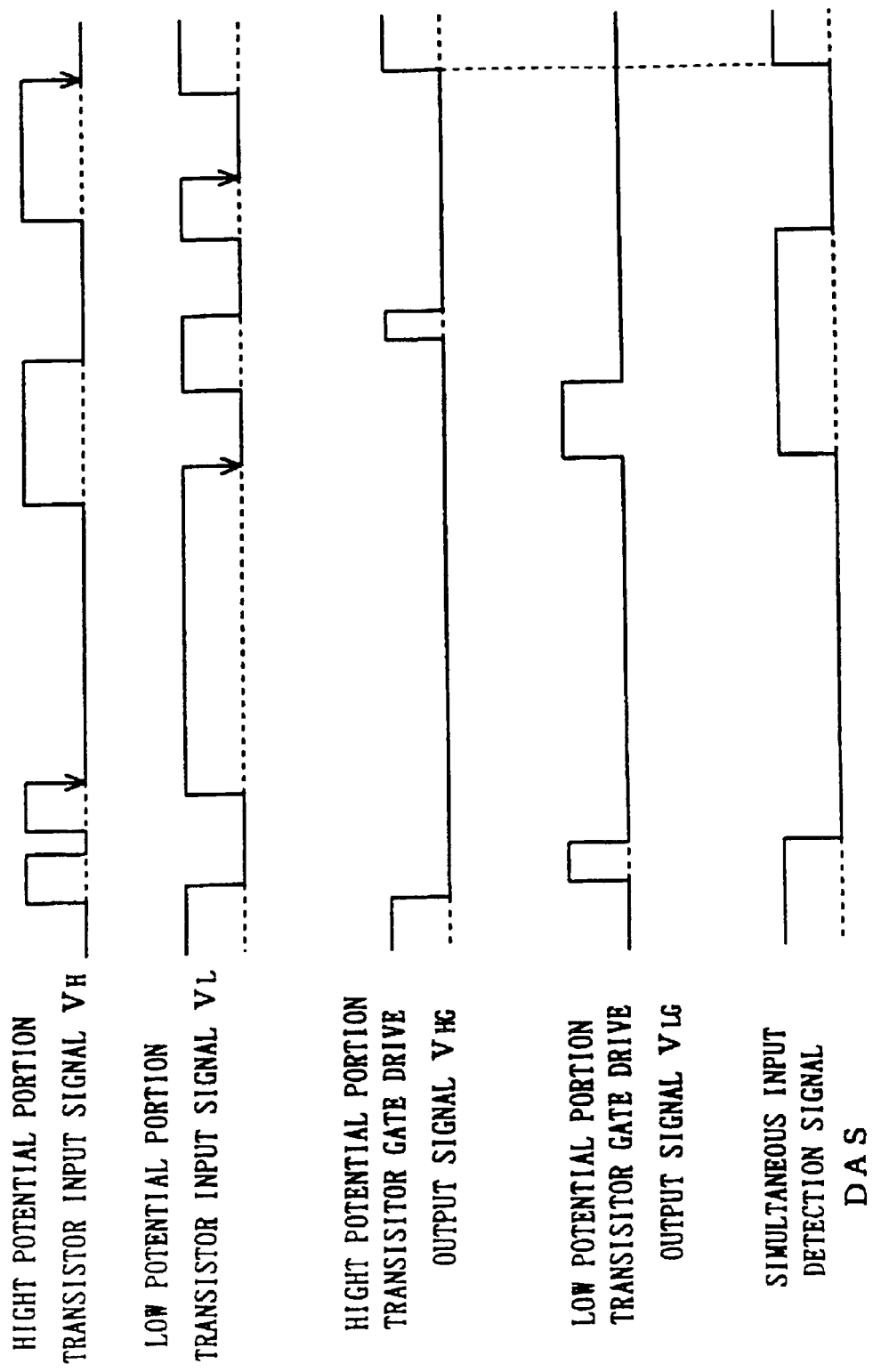
FIG. 18 is a timing chart illustrating the operation of the power device controller of the eighth preferred embodiment.

FIG. 18 is a timing chart illustrating the operation of the input interlock circuit 60. Referring to FIG. 18, when a high potential portion transistor gate drive output signal $V_{HG}$ and a low potential portion transistor gate drive output signal $V_{LG}$ become "low" at the same time, the input interlock circuit 60 latches the simultaneous input detection signal DAS. Then, the simultaneous input detection signal DAS is reset at the time when the later one of a high potential portion transistor input signal $V_H$ and a low potential portion transistor input signal $V_L$ changes from "H" to "L".

The output processing circuit 70 receives the abnormality signals AS1, AS2 indicative of the abnormal conditions in the transistors Q1, Q2, the temperature abnormality detection signal TAS, and the power supply voltage abnormality detection signal PAS as well as the simultaneous input detection signal DAS and then converts the respective detection signals into pulses, which are in turn applied to an error output signal generator circuit 80.

The error output signal generator circuit 80 identifies the simultaneous input detection signal DAS and the power supply voltage abnormality detection signal PAS as signals indicative of voltage abnormality, the abnormality signals AS1 and AS2 as signals indicative of current abnormality, and the temperature abnormality detection signal TAS as an error signal indicative of temperature abnormality, and individually feeds back the respective signals to the external controller 6. The error output signal generator circuit 80 also receives and feeds back the analog output voltage $V_{cx}$ from the analog current detector circuit 9 to the external controller 6 as an error signal.

<Characteristic Function and Effect of Eighth Preferred Embodiment>

According to the power device controller of the eighth preferred embodiment of the present invention, there are provided the abnormality detection means indicative of the abnormal conditions in the transistors Q1, Q2, and the protective circuits including the temperature abnormality detector circuit TA and the power supply voltage abnormality detector circuit PA. Feedback of the error signals to the external controller 6 based on the ground potential does not need an interface circuit including a particular insulating element. This increases the speed of error signal transmission and the responsiveness to the various abnormal conditions.

<Ninth Preferred Embodiment>

The power device controller according to the present invention described in the first to eighth preferred embodiments is adapted to transmit and receive the control signal or the feedback signal through the level shift circuit employing the transistor having the high breakdown voltage characteristic (for example, the breakdown voltage of not less that 800 V), eliminating the need for the particular insulating elements such as photocouplers. Further, the use of the charge pump circuit as the control power supply for the power devices eliminates the need for the individual power supplies in the high and low potential portions but permits the single power supply to operate the high and low potential portions. It is accordingly unnecessary to provide an exteriorly attached interface for the insulating elements and a large-sized power supply device, achieving the integrated power device controller including the protective circuits without difficulty.

Description will now given on a drive controller for a three-phase motor according to a ninth preferred embodiment of the present invention designed such that the integrated power device controller including the protective devices, the power devices, and a control power supply are encapsulated in a single package (referred to as "IPMed" hereinafter).

Figure 19:
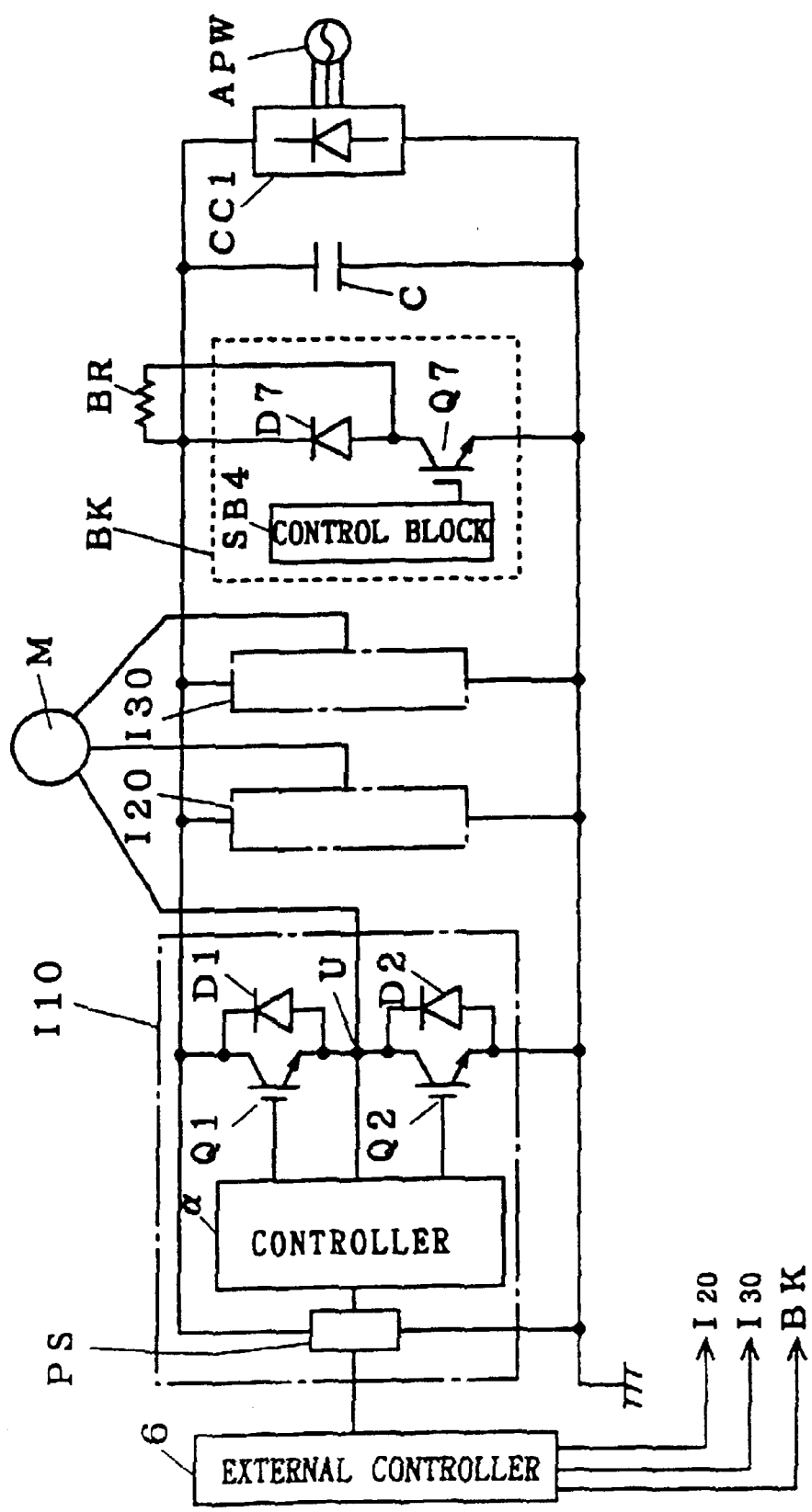
FIGS. 19 and 20 illustrate a drive controller for a motor according to a ninth preferred embodiment of the present invention.

FIG. 19 illustrates an IPMed three-phase motor drive controller IPM1. Referring to FIG. 19, an AC three-phase power supply APW serving as a power supply for an AC input three-phase motor M is connected to a converter circuit CC1 between the lines P and N, and the respective phases of the AC input three-phase motor M are connected to inverter circuits 110, 120, 130 for controlling the phases, respectively.

Figure 26:
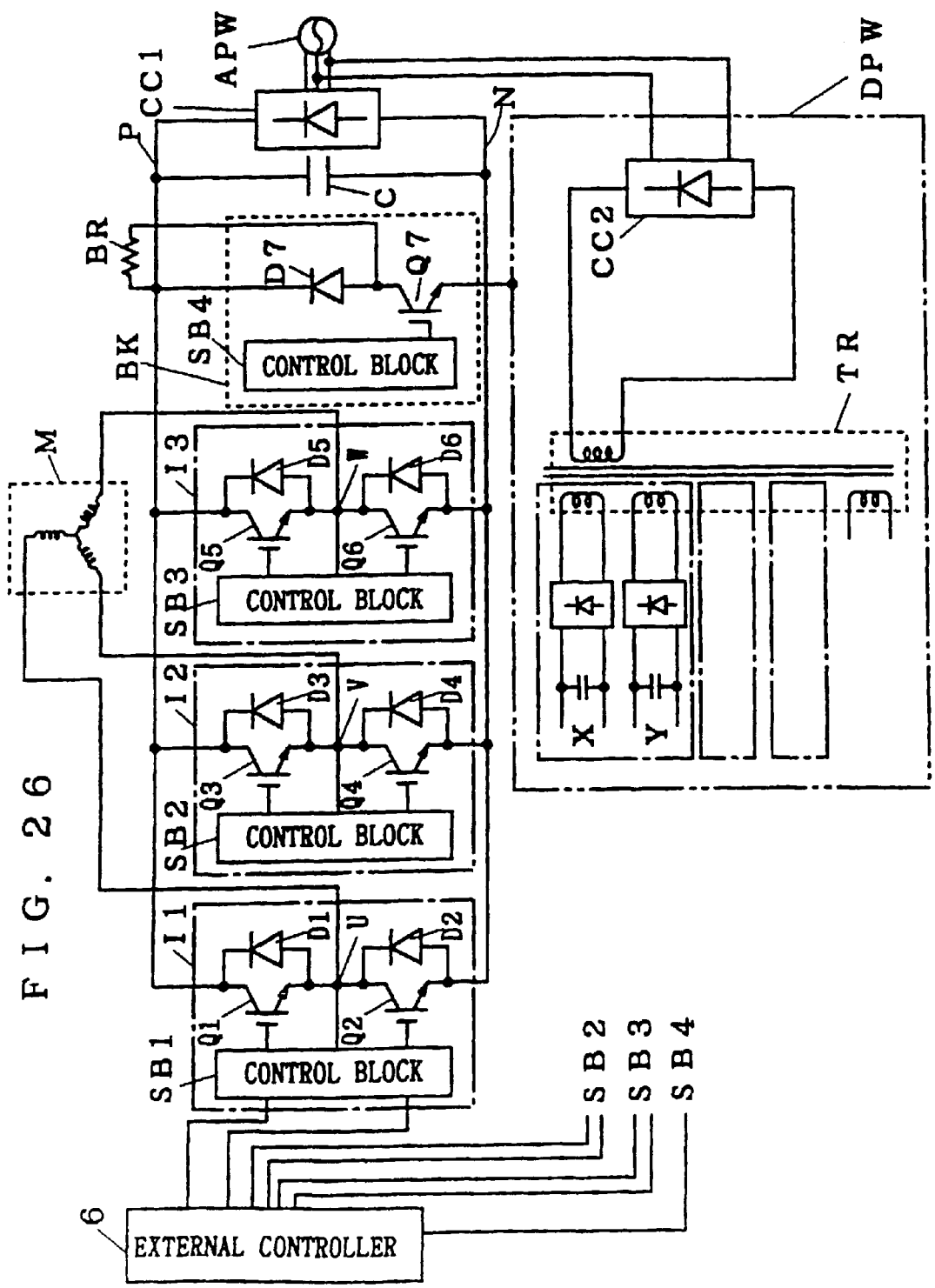
FIGS. 26 and 27 illustrate a background art drive controller for a motor employing a controller for a power device.
Figure 27:
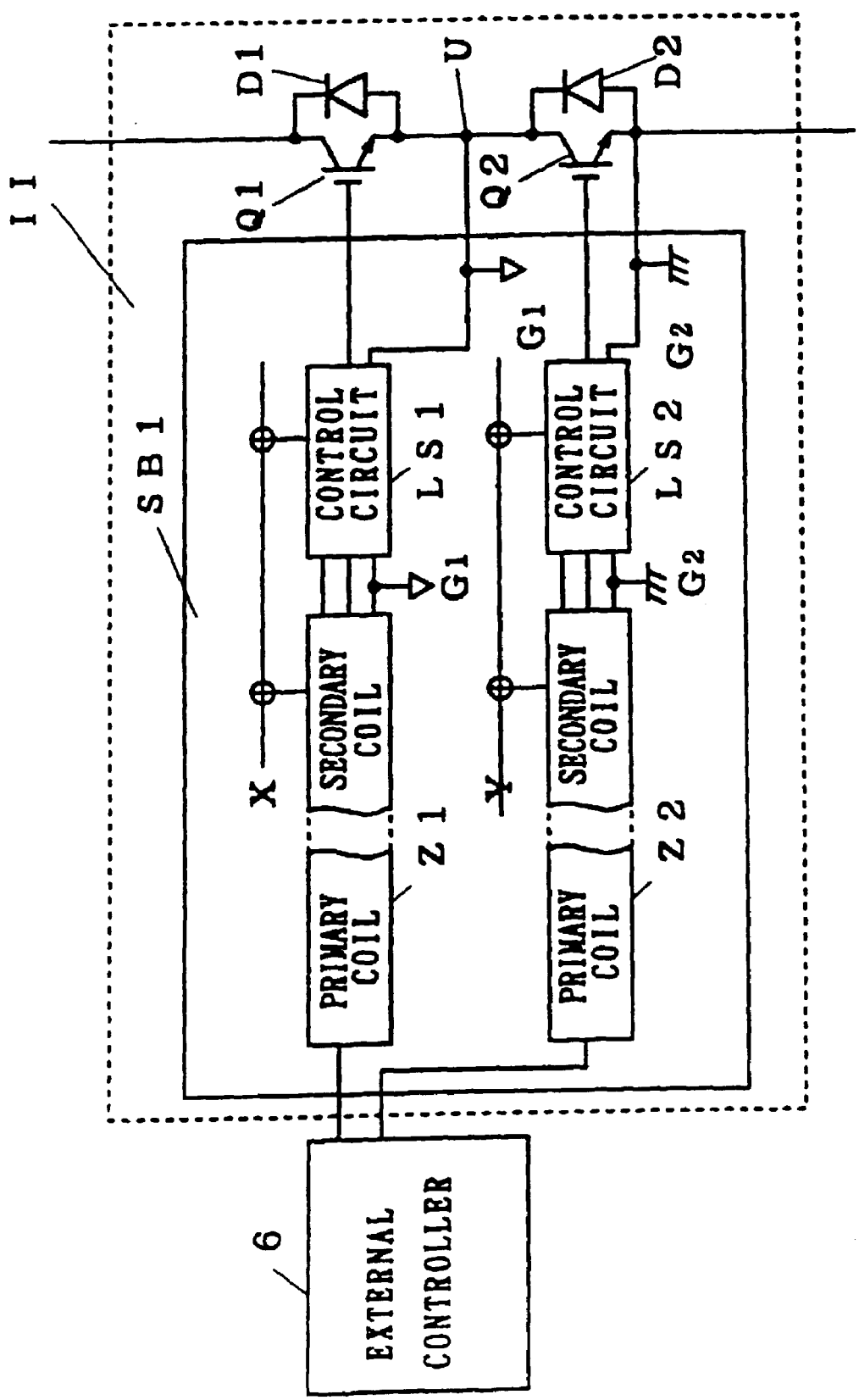

The inverter circuit 110 includes the transistors Q1 and Q2 which are power devices, such as IGBTs (insulated gate bipolar transistors), totem-pole connected between the lines P and N, a controller α, and the control power supply PS. The inverter circuits I20 and I30 have a similar construction and the description thereof will be omitted herein. The controller α is similar in construction to the controller α8 of the eighth preferred embodiment described with reference to FIG. 16, and the description thereof in similar portions is omitted herein. Further, a brake circuit BK of the ninth preferred embodiment is also similar in construction to that of the conventional three-phase drive controller described with reference to FIG. 26, and the description thereof in similar portions is omitted herein.

<Control Power Supply>

Figure 20:
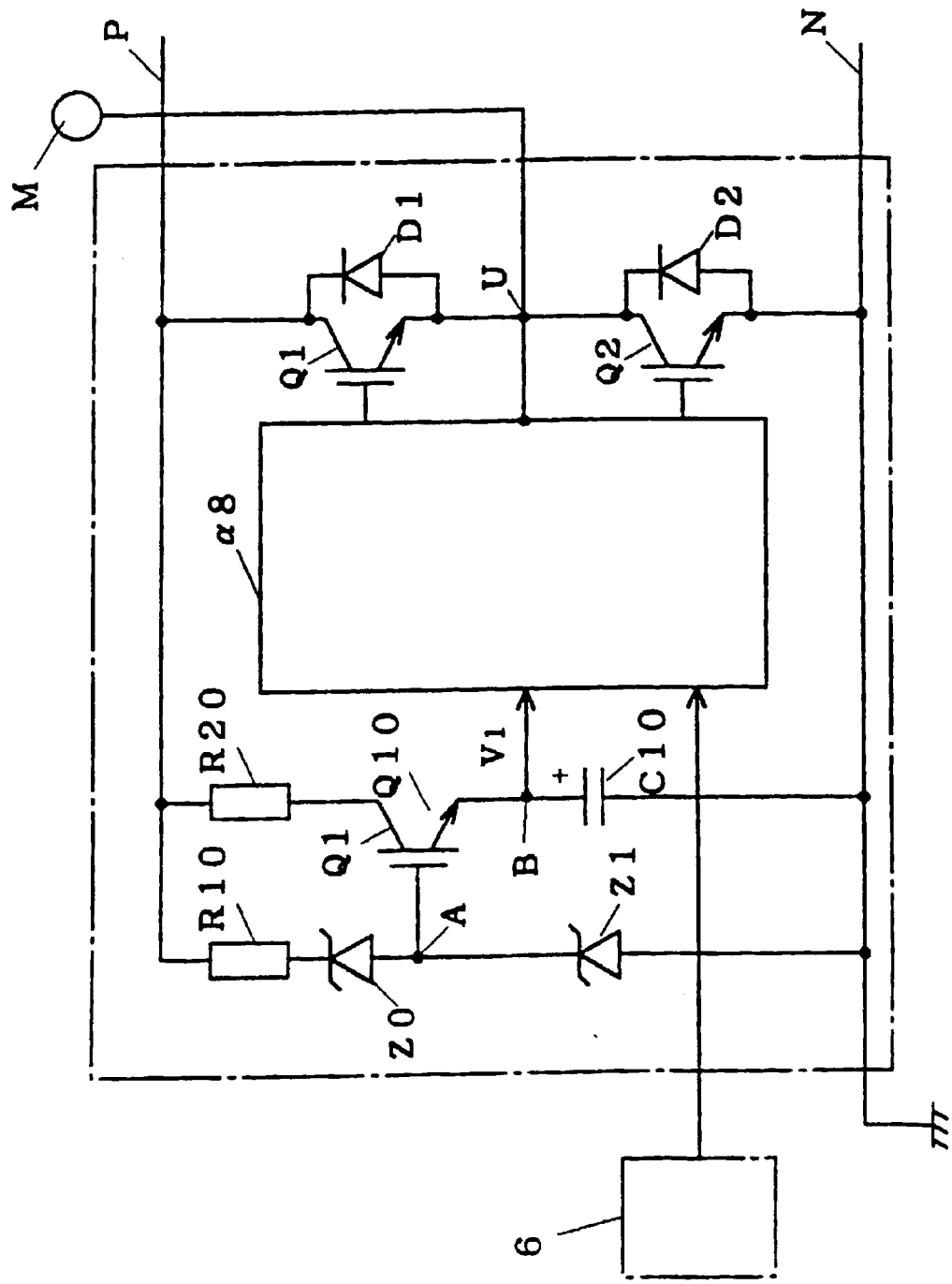

The construction of the control power supply PS will be described below. FIG. 20 is a circuit diagram of the control power supply PS. Referring to FIG. 20, a circuit including a resistance element R10 and voltage clamping Zener diodes $Z_0$, $Z_1$ which are connected in series in this order, and a circuit including a resistance element R20, a transistor Q10, and a capacitor C10 which are connected in series in this order are connected in parallel between the main power supply lines P and N. The gate electrode of the transistor Q10 is connected to a connection point A adjacent the anode of the Zener diode $Z_0$.

The operation of the control power supply PS is discussed below. The potential between the connection point A and the line P is designated as $VZ_0$, and the potential between the connection point A and the line N is designated as $VZ_1$. A main power supply voltage obtained by converting the three-phase AC power supply is applied between the lines P and N. When the potential $VZ_1$ reaches a voltage sufficient to turn ON the transistor Q10, current flows between the collector and emitter of the transistor Q10 to charge the transistor Q10. The voltage across the capacitor C10 is determined by the Zener diode Z1. To use the charged capacitor C10 as a power supply for the controller α, the power supply line of the controller α is connected to a connection point B of the capacitor C10 and the transistor Q10. The control power supply described with reference to FIG. 20 corresponds to the control power supply PS of the controller α8 of the eighth preferred embodiment described with reference to FIG. 16. The transistor Q10 is illustrated as an IGBT in FIG. 20, but may be an FET.

As above described, the three inverter circuits 110, 120, 130 individually include the control power supply circuits for operating the controller a. It is unnecessary to provide the DC power supply DPW having the isolation transformer TR outside the device and to supply power to the control circuit through a long path line from the DC power supply DPW, which have been done in the conventional three-phase motor drive controller of FIG. 26. This provides for size reduction of the three-phase motor drive controller and high-quality power supply without noises on the lines.

<Packaging>

Figure 21:
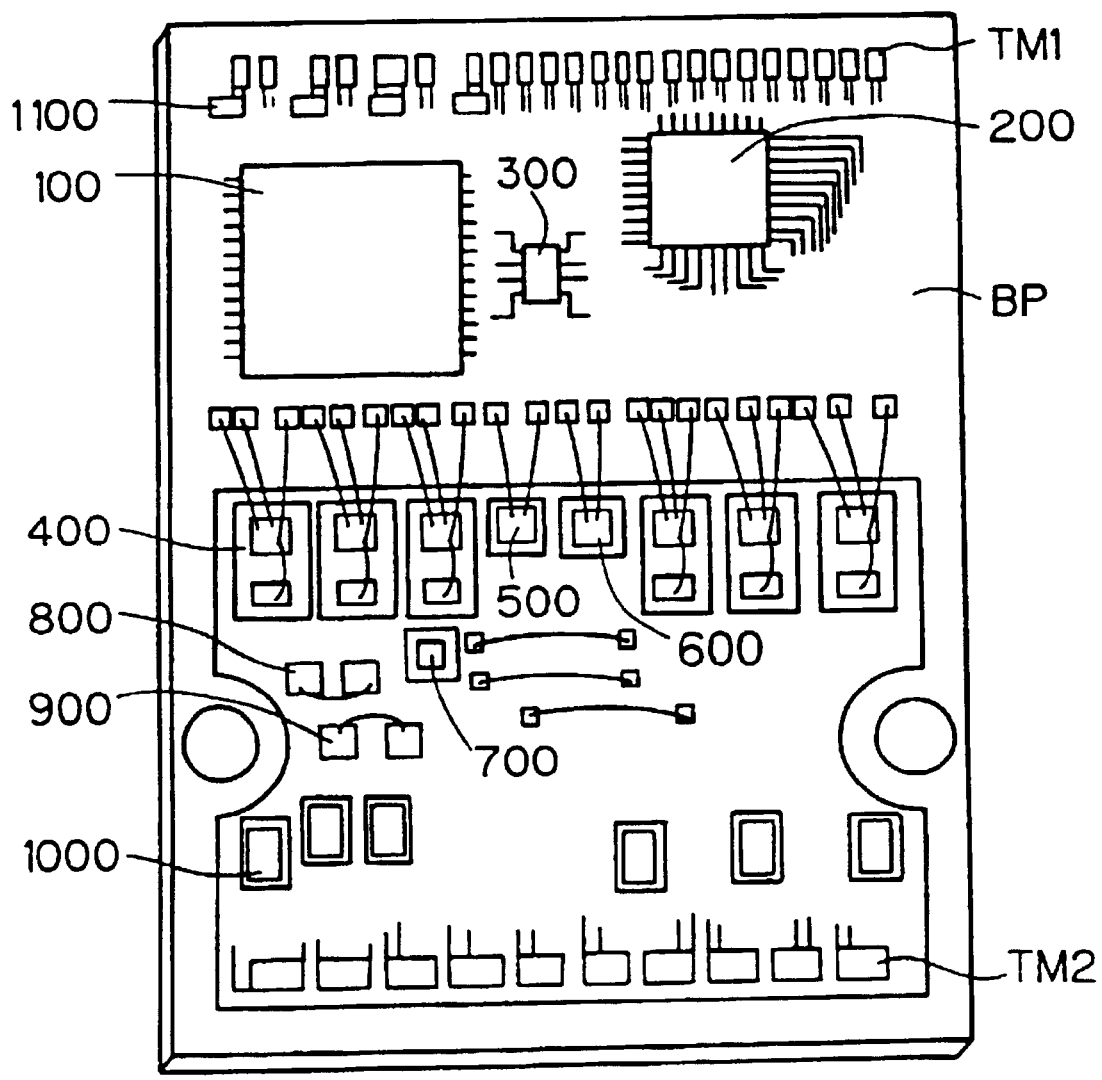
FIG. 21 is a plan view of the motor drive controller of the ninth preferred embodiment in a packaged form.

Description will be given on packaging of the IPMed three-phase motor drive controller which is an example of the devices known as "IPM", or the module designed such that a power element such as a power transistor and a controller for drive controlling the power element are encapsulated in a single package. FIG. 21 is a plan view of the IPMed three-phase motor drive controller IPM1 in a packaged form. Referring to FIG. 21, the three-phase motor drive controller including a control portion and a power portion is formed on a package base BP serving as a package substrate. The control portion includes one of the power device controllers of the respective preferred embodiments described above which has the integrated high potential portion as a high potential IC 100 and the integrated low potential portion as a low potential IC 200. The control portion further includes a control power supply IC 300 for the power device controller, control terminals TM1 for input and output of the input signal and the feedback signal, and a charge pump circuit 1100.

The power portion comprises a power device portion 400 including inverter circuits each having a pair of transistor and diode; a temperature abnormality detector circuit 500 provided adjacent the power device portion 400 and for detecting the temperatures of the power device portion 400; a brake circuit transistor 600 and a brake circuit diode 700 both forming a brake circuit for applying electrical brakes to the three-phase motor; a main power supply transistor 900 and a main power supply diode 1000 for rectifying the three-phase AC power supply to use the power supply as the main power supply for the power device; main circuit terminals TM2 for providing input from the three-phase AC power supply and an inverter output to the three-phase motor; and an active filter circuit 800 for improving the power rate of the inverter circuits.

Figure 22:
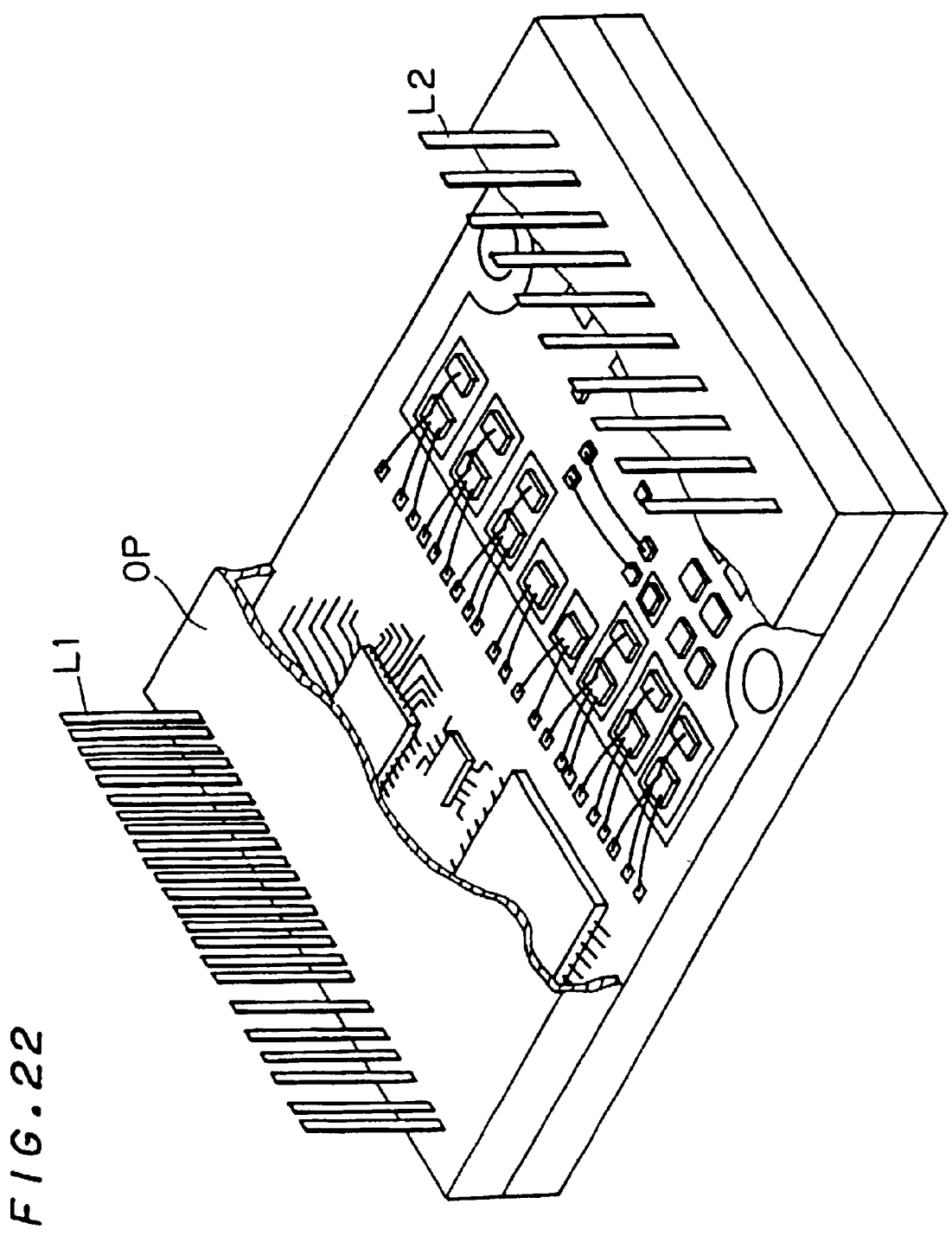
FIG. 22 is a perspective view of the packaged motor drive controller of the ninth preferred embodiment.

FIG. 22 is a perspective view of the above described IPMed three-phase motor drive controller IPMI in the final form. Referring to FIG. 22, an upper package OP is formed to cover an upper portion of the device, and control pins L1 and output pins L2 corresponding respectively to the control terminals TM1 and the main circuit terminals TM2 are connected to external equipments.

The correlation with the construction of the three-phase motor drive controller described with reference to FIG. 19 is discussed below. The controller a of FIG. 19 corresponds to the high and low potential ICs 100 and 200, the control power supply PS of FIG. 19 corresponds to the control power supply IC 300, the transistors Q1, Q2 and diodes D1, D2 of FIG. 19 correspond to the power device portion 400, the converter circuit CC1 of FIG. 19 corresponds to the main power supply transistor 900 and the main power supply diode 1000, and the transistor Q7 and the diode D7 of FIG. 19 correspond to the brake circuit transistor 600 and the brake circuit diode 700, respectively.

<Another Packaging>

Figure 23:
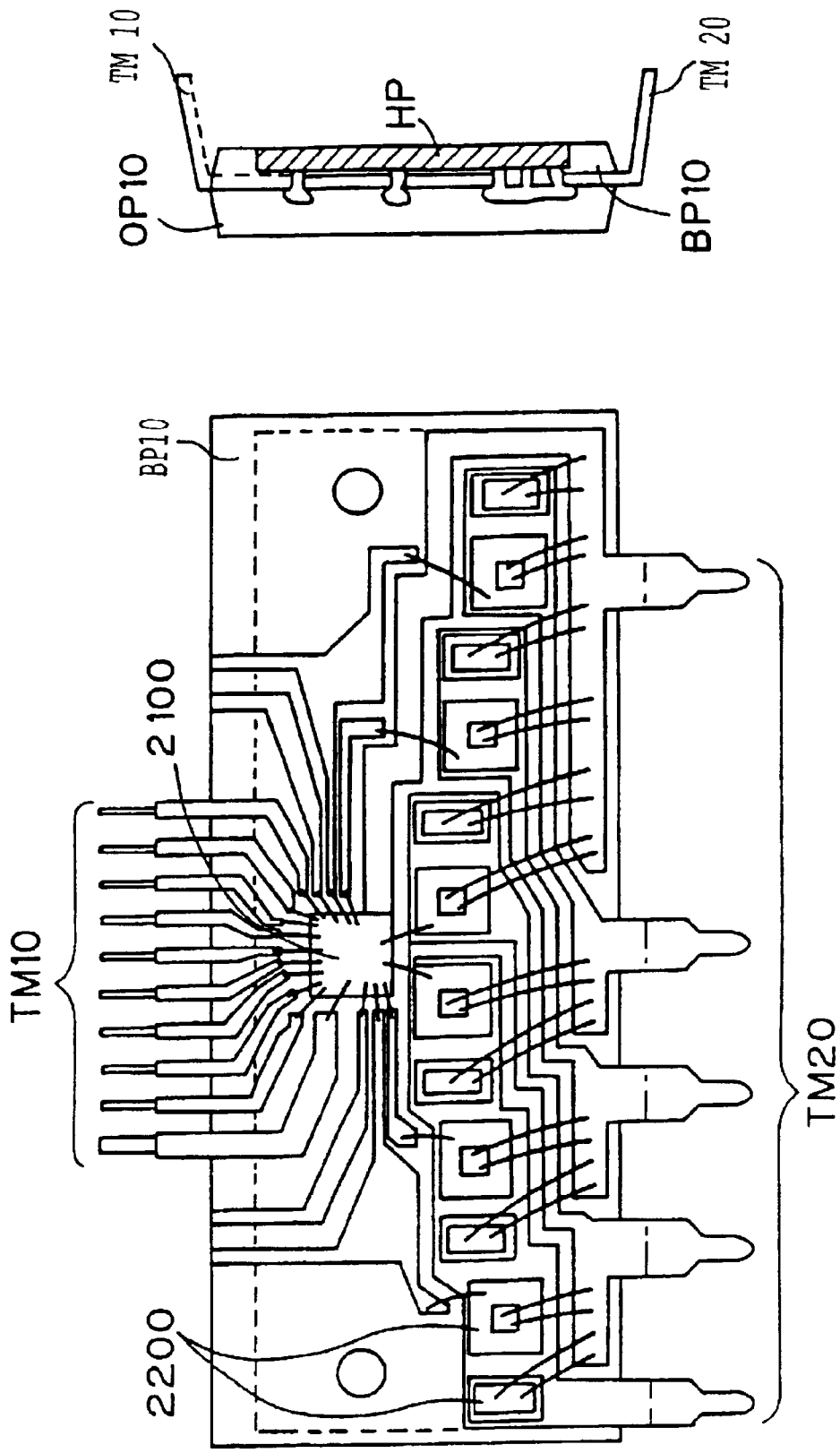
FIG. 23 is a plan view of the motor drive controller of the ninth preferred embodiment in another packaged form.

The IPMed three-phase motor drive controller in another packaged form is described. FIG. 23 is plan and sectional views in perspective illustrating the packaging of an IPMed three-phase motor drive controller IPM2. Referring to FIG. 23, on a package base BP10 having a heat sink HP are provided an integrated control circuit 2100, an integrated power device portion 2200, control terminals TM10, and main circuit terminals TM20, with the top covered with an upper package OP10. The controller of FIG. 23 is not divided into the high and low potential portions but is formed on the same IC substrate, thereby reduced in size.

Figure 24:
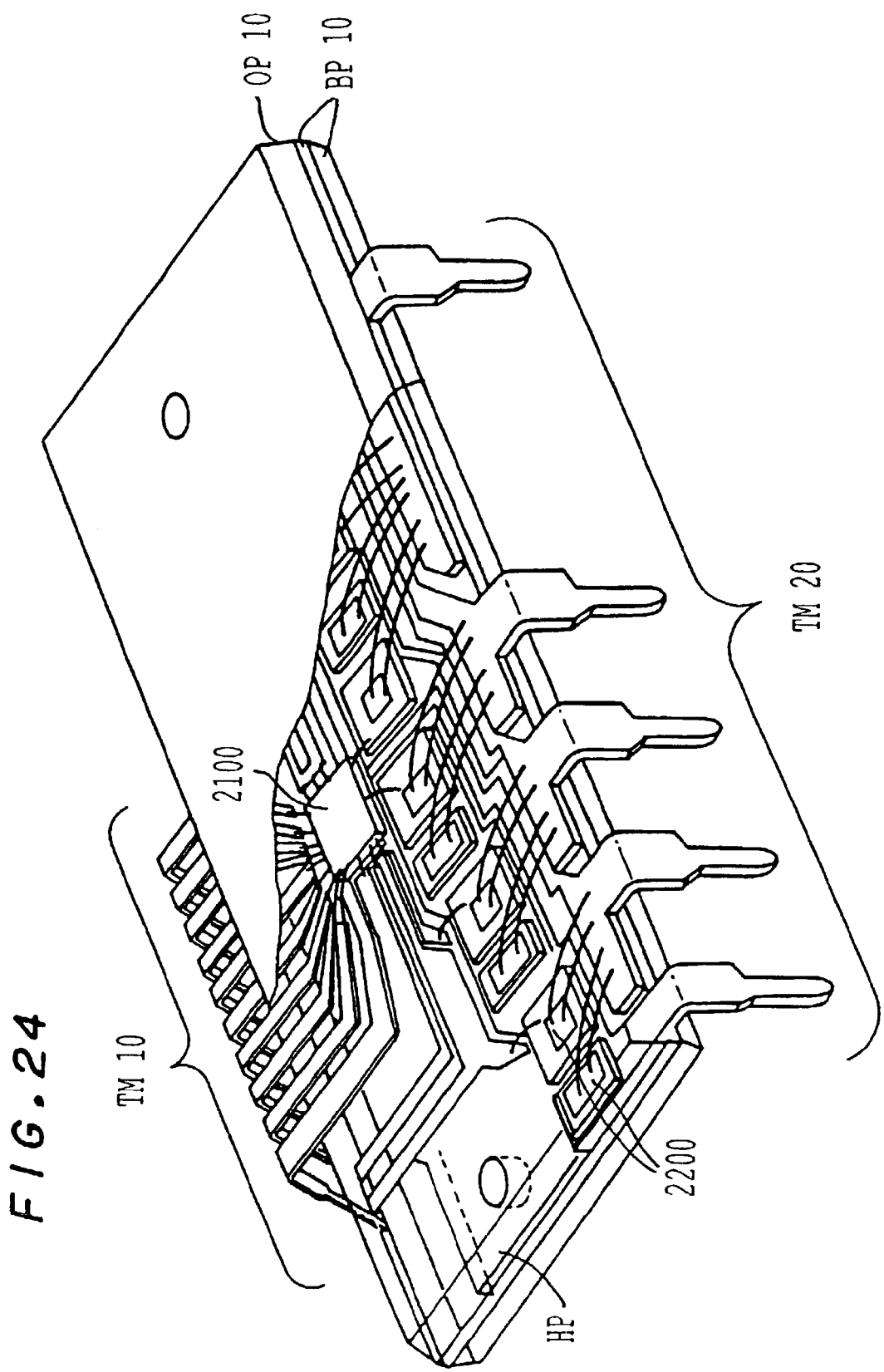
FIG. 24 is a perspective view of the packaged motor drive controller of FIG. 23 according to the ninth preferred embodiment.

FIG. 24 is a perspective view of the above described IPMed three-phase motor drive controller IPM2 in the final form. The same reference labels used to describe FIG. 23 also apply to FIG. 24.

FIG. 24 is a perspective view of the above described IPMed three-phase motor drive controller IPM2 in the final form.

<Characteristic Function and Effect of Ninth Preferred Embodiment>

According to the three-phase motor drive controller of the ninth preferred embodiment of the present invention, packaging of the integrated power device controller α and control power supply PS, the brake circuit BK and the active filter circuit 800 allows further size reduction of the three-phase motor drive controller.

<Tenth Preferred Embodiment>

Figure 25:
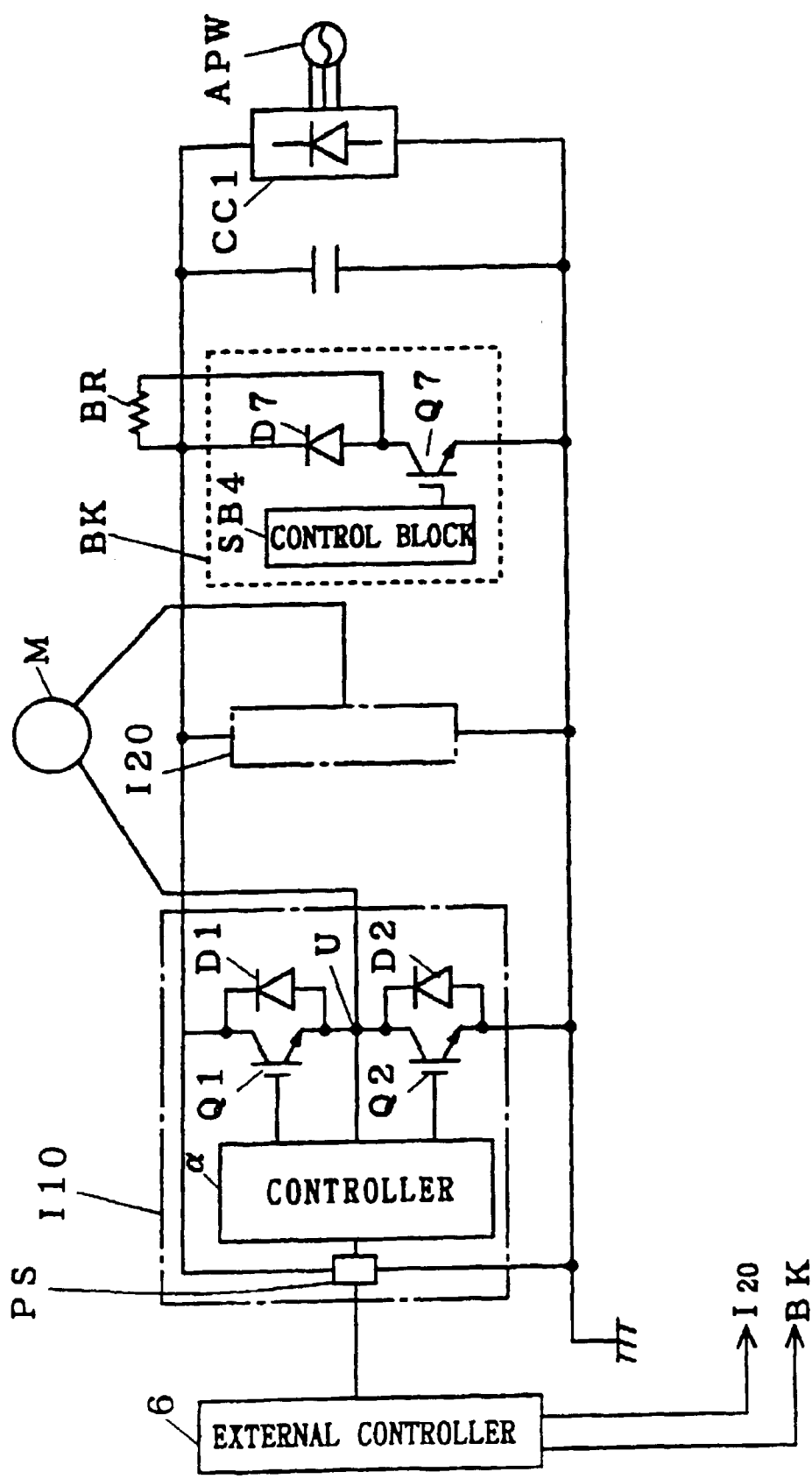
FIG. 25 illustrates the motor drive controller according to a tenth preferred embodiment of the present invention.

Referring to FIG. 25, a tenth preferred embodiment provides the application of the power device controller of the present invention to an AC input single-phase motor drive controller, which attaining similar effects. Two inverter circuits 110 and 120 are used since the phase is single. Other constructions of the AC input single-phase motor drive controller are similar to those of the three-phase motor drive controller, and the description thereof will be omitted herein.

While the invention has been shown and described in detail, the foregoing description is in all aspects illustrative and not restrictive. It is therefore understood that numerous modifications and variations can be devised without departing from the scope of the invention.

What is claimed is:

1. A controller for controlling a power device in response to an input signal wherein said power device includes a series connection of a first and second semiconductor device which are connected between first and second main power supply potentials with the conduction of at least said first semiconductor device being controlled by a control signal and with a common node of said first and second semiconductor device providing an output and with said input signal being generated as a function of said second main power supply potential, said controller comprising:

first signal generating means for generating a first signal in response to said input signal;

level shift means for changing an output level of said first signal to a value which is a function of said first main power supply potential in order to produce a second signal; and a first control signal generator means for generating said control signal for said first semiconductor device in response to said second signal, wherein said level shift means includes at least one level shifting semiconductor element wherein said semiconductor element is controlled by said first signal and said at least one level shifting semiconductor element exhibiting breakdown voltage characteristics whereby a breakdown voltage has a value not less than a voltage in the range between a value of said first and a value of said second main power supply potential.

2. The controller of claim 1, wherein said first signal generator means for generating said first signal includes pulse generator means for generating a pulse in response to a level transition of said input signal, said second signal is a shifted pulse obtained by level-shifting said pulse by said level shift means, and said control signal generator means includes latch means for latching said shifted pulse to generate said control signal for said first semiconductor device.

3. The controller of claim 2, wherein:

said pulse generator means generates first and second pulses in response to positive and negative level transitions of said input signal, respectively, with said first and second pulses constituting said first signal, said level shift means includes first and second level shifting semiconductor elements provided between said first and second main power supply potentials and having a breakdown voltage characteristic which is not less than a voltage between said first and second main power supply potentials, said first and second level shifting semiconductor elements level-shifting said first and second pulses toward said first main power supply potential to generate first and second shifted pulses, thereby to provide said second signal, and said latch means latches said second signal including said first and second shifted pulses to use said second signal as said control signal for said first semiconductor device.

4. The controller of claim 3, further comprising:

first operation abnormality detector means for detecting an abnormal operation in said first semiconductor device to generate a first abnormality indication signal having a level based on said first main power supply potential, said level shift means further includes a third level shifting semiconductor element provided between said first and second main power supply potentials and having a breakdown voltage characteristic which is not less than a voltage between said first and second main power supply potentials, said third level shifting semiconductor element level-shifting said first abnormality indication signal toward said second main power supply potential to produce a second abnormality indication signal, and said second abnormality indication signal is a feedback signal to a circuit for generation of said input signal.

5. The controller of claim 4, wherein:

said first operation abnormality detector means includes abnormality indication signal pulse generator means for generating a pulse in response to level transition of said first abnormality indication signal to use said pulse as a pulse signal for said first abnormality indication signal, said second abnormality indication signal is a shifted pulse obtained by level-shifting said pulse signal for said first abnormality indication signal by said third level shifting semiconductor element, and said level shift means includes feedback signal latch means for latching said shifted pulse as said second abnormality indication signal to generate said feedback signal to said circuit for generation of said input signal.

6. The controller of claim 5, wherein:

a first controllable semiconductor element included in said first semiconductor circuit and said first and second level shifting semiconductor elements are of a first conductivity type, and said third level shifting semiconductor element is of a second conductivity type.

7. The controller of claim 6, wherein:

said control signal for said first controllable semiconductor element is a first control signal, said second semiconductor device includes a second controllable semiconductor element, controllable in response to a second control signal, said controller further comprising:

second control signal generator means for generating said second control signal in response to said input signal.

8. The controller of claim 7, further comprising:

a current detecting resistor between an electrode of said second controllable semiconductor element which outputs a main current and said second main power supply potential for detecting and converting said main current flowing through said second controllable semiconductor element into a voltage signal corresponding to said main current; and analog signal output means receiving said voltage signal corresponding to said main current for feeding back a value of said main current indicated by said voltage signal to said second control signal generator means in the form of an analog signal.

9. The controller of claim 8, wherein said analog signal output means includes:

delay signal generator means for causing said second control signal to delay to generate a delay signal;

a gate element having an input and an output and receiving said voltage signal at said input for opening and closing a transmission path of said voltage signal from said input to said output in response to said delay signal; and a capacitor between said output of said gate element and said second main power supply potential, and wherein said analog signal is provided at said output.

10. The controller of claim 4, further comprising:

second operation abnormality detector means for detecting an abnormal operation in said second semiconductor circuit to generate a third abnormality indication signal having a level based on said second main power supply potential; and abnormality indication signal identifying means for identifying said second and third abnormality indication signals to feed back a result of the identification to said circuit for generation of said input signal.

11. The controller of claim 7, further comprising:

input interlock means for detecting timings of generation of said first and second control signals to prevent said first and second control signals from being outputted simultaneously.

12. The controller of claim 7, further comprising:

PWM signal generator means for generating first and second PWM signals in response to said input signal, said first and second control signals being generated in response to said first and second PWM signals, respectively.

13. The controller of claim 1, wherein said controller is integrated on a single or a plurality of semiconductor substrates and is driven by a single operation power supply for feeding a voltage between said first and second main power supply potentials.

14. A drive controller for a motor, comprising:

a controller for controlling a power device in response to an input signal wherein said power device includes a series connection of a first and second semiconductor device which are connected between first and second main power supply potentials with the conduction of at least said first semiconductor device being controlled by a control signal and with a common node of said first and second semiconductor device providing an output and with said input signal being generated as a function of said second main power supply potential, said controller comprising:

first signal generating means for generating a first signal in response to said input signal;

level shift means for changing an output level of said first signal to a value which is a function of said first main power supply potential in order to produce a second signal; and a first control signal generator means for generating said control signal for said first semiconductor device in response to said second signal, wherein said level shift means includes at least one level shifting semiconductor element wherein said semiconductor element is controlled by said first signal and said at least one level shifting semiconductor element exhibiting breakdown voltage characteristics whereby a breakdown voltage has a value not less than a voltage in the range between a value of said first and a value of said second main power supply potential;

wherein said controller is integrated on a single or a plurality of semiconductor substrates and is driven by a single operation power supply for feeding a voltage between said first and second main power supply potentials;

a brake circuit in parallel with said first and second semiconductor devices for applying an electrical brake to said motor in response to a predetermined stop signal; and a converter circuit for rectifying an AC power supply to provide said first and second main power supply potentials, said first and second semiconductor devices, said controller, said brake circuit and said converter circuit being provided in the form of a module.

15. The drive controller of claim 14, wherein said module includes an active filter circuit for increasing a power rate of said drive controller.

16. The drive controller of claim 14, wherein said module includes a power supply circuit for supplying power for said controller from said AC power supply.

17. The drive controller of claim 16, further comprising:

a charge pump circuit between said power supply circuit and a connection point of said first and second semiconductor devices, said charge pump circuit including a first diode and a capacitor connected in series in order from a positive output of said power supply circuit; and a second diode between said first diode and a control electrode of said first controllable semiconductor element of said first semiconductor device, said second diode having a negative electrode connected to a negative electrode of said first diode.

* * * * *